(12) United States Patent
Kaneko et al.

(10) Patent No.: US 9,236,334 B2
(45) Date of Patent: Jan. 12, 2016

(54) WIRING SUBSTRATE AND METHOD FOR MANUFACTURING WIRING SUBSTRATES

(75) Inventors: Kentaro Kaneko, Nagano (JP); Toshiaki Aoki, Nagano (JP); Hiromi Denda, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 200 days.

(21) Appl. No.: 13/410,031

(22) Filed: Mar. 1, 2012

(65) Prior Publication Data
US 2012/0222894 A1 Sep. 6, 2012

(30) Foreign Application Priority Data
Mar. 4, 2011 (JP) ................................ 2011-048021

(51) Int. Cl.
*H05K 1/09* (2006.01)
*H01L 23/498* (2006.01)
(Continued)

(52) U.S. Cl.
CPC .... *H01L 23/49811* (2013.01); *H01L 23/49866* (2013.01); *H05K 3/244* (2013.01); *H01L 23/49816* (2013.01); *H01L 23/49822* (2013.01); *H01L 2224/16225* (2013.01); (Continued)

(58) Field of Classification Search
CPC ........... H01L 2924/01079; H01L 2924/01078; H01L 2224/16; H01L 2924/01029; H01L 2924/15311; H01L 2224/16225; H01L 2224/32225; H01L 2224/48227; H01L 2224/48228; H01L 2224/73204; H01L 2924/01322; H05K 1/111; H05K 1/112; H05K 3/429; H05K 2201/096; H05K 3/4602; H05K 1/115; H05K 3/3452; H05K 3/3436

USPC ................. 174/260–265; 361/760, 792–795; 257/779, 780; 438/612, 613
See application file for complete search history.

(56) References Cited

U.S. PATENT DOCUMENTS 6,191,489 B1 * 2/2001 Igel et al. ...................... 257/778
6,251,502 B1 * 6/2001 Yasue et al. .................. 428/209
(Continued)

FOREIGN PATENT DOCUMENTS

| JP | 2000-323613 A | 11/2000 |
| JP | 2001-217523 | 8/2001 |

(Continued)

OTHER PUBLICATIONS

Office action from corresponding Japanese application No. 2011-048021, dated May 27, 2014, pp. 1-3.

*Primary Examiner* — Jenny L Wagner
*Assistant Examiner* — Pete Lee
(74) *Attorney, Agent, or Firm* — Wolf, Greenfield & Sacks, P.C.

(57) ABSTRACT

A wiring substrate includes a wiring layer, an outermost insulating layer laminated to the wiring layer, and a pad electrically connected to the wiring layer and exposed from a surface of the outermost insulating layer. The pad consists essentially of a first metal layer and a second metal layer. The first metal layer includes a first surface, which is exposed from the surface of the outermost insulating layer, and a second surface, which is located opposite to the first surface. The second metal layer includes is formed between the second surface of the first metal layer and the wiring layer. The first metal layer is formed from a metal selected from gold or silver or from an alloy including at least one of gold and silver. The second metal layer is formed from palladium or a palladium alloy.

8 Claims, 16 Drawing Sheets

(51) Int. Cl.
*H05K 3/24* (2006.01)
*H05K 1/11* (2006.01)
*H05K 3/46* (2006.01)

(52) U.S. Cl.
CPC .............. *H01L 2224/32225* (2013.01); *H01L 2224/48227* (2013.01); *H01L 2224/48228* (2013.01); *H01L 2224/73204* (2013.01); *H01L 2224/73265* (2013.01); *H01L 2924/01322* (2013.01); *H05K 1/112* (2013.01); *H05K 3/4661* (2013.01); *H05K 2203/0307* (2013.01)

(56) References Cited

U.S. PATENT DOCUMENTS

| | | | |
|---|---|---|---|
| 7,390,974 B2 * | 6/2008 | Shirai et al. | 174/263 |
| 7,582,551 B2 * | 9/2009 | Kodani et al. | 438/597 |
| 7,595,553 B2 * | 9/2009 | Nagamatsu et al. | 257/731 |
| 7,954,234 B2 * | 6/2011 | Kodani et al. | 29/852 |
| 2003/0072928 A1 * | 4/2003 | Edelstein et al. | 428/209 |
| 2006/0283625 A1 | 12/2006 | Yamamichi et al. | |
| 2008/0122079 A1 | 5/2008 | Chen et al. | |
| 2008/0217047 A1 * | 9/2008 | Hu | 174/257 |

FOREIGN PATENT DOCUMENTS

| | | |
|---|---|---|
| JP | 2007-027706 | 2/2007 |
| JP | 2008-004687 | 1/2008 |

* cited by examiner

US 9,236,334 B2

WIRING SUBSTRATE AND METHOD FOR MANUFACTURING WIRING SUBSTRATES

CROSS-REFERENCE TO RELATED APPLICATIONS

This application is based upon and claims the benefit of priority from prior Japanese Patent Application No. 2011-048021,filed on Mar. 4, 2011, the entire contents of which are incorporated herein by reference.

BACKGROUND OF THE INVENTION

The present invention relates to a wiring substrate and a method for manufacturing a wiring substrate.

In the prior art, in order to achieve a high density wiring pattern for a wiring substrate used in a semiconductor package or the like, a build-up wiring substrate is known in which a build-up wiring layer and an insulating layer are laminated on upper and lower surfaces of a core substrate.

The density of semiconductor chips mounted on build-up wiring substrates have become high. Thus, there is a demand for build-up wiring substrates that further increase the wiring pattern density and reduce the substrate thickness. In a build-up wiring substrate, the layered portion of a wiring layer and insulating layer can be formed thinly through a build-up process. However, the portion of a core substrate is required to have a suitable thickness in order to provide the wiring substrate with rigidity. Consequently, there have been limits on the extent to which the thickness of the entire wiring substrate can be reduced. Thus, a so-called coreless substrate has been proposed, which is a wiring substrate that excludes the core substrate (support member) to further reduce the thickness of the wiring substrate (refer to, for example, Japanese Patent Application Publication No. 2000-323613).

The basic processing for a coreless substrate prepares a provisional substrate as a support body, forms a pad on the provisional substrate, laminates a desired number of build-up wiring layers and insulating layers, and finally removes the provisional substrate. In such a coreless substrate, unlike a conventional build-up wiring substrate, there is no core substrate. Thus, the thickness of the wiring substrate can be reduced.

A pad formed on the support body generally has a laminated structure including a plurality of metal layers. Such a typical laminated structure may be a two-layer structure, which includes a gold (Au) layer and a nickel (Ni) layer, or a three-layer structure, which includes an Au layer, a Pd layer, and an Ni layer. A pad having such a structure has superior wire bonding properties. However, when the pad is connected to lead (Pb)-free solder, the Ni forms a trialloy with tin (Sn) and copper (Cu). This decreases the drop impact resistance.

Another typical laminated structure is a two-layer structure formed by an Organic Solderability Preservative (OSP) process including a film (OSP film) of water-soluble preflux and a Cu layer. In a pad having such a structure, the drop impact resistance does not decrease. However, since no Ni is present, the OSP film is prone to oxidization and discoloration.

SUMMARY OF THE INVENTION

One aspect of the present invention is a wiring substrate including a wiring layer. An outermost insulating layer is laminated to the wiring layer. A pad is electrically connected to the wiring layer and exposed from a surface of the outermost insulating layer. The pad consists essentially of a first metal layer and a second metal layer. The first metal layer includes a first surface, which is exposed from the surface of the outermost insulating layer, and a second surface, which is located opposite to the first surface. The second metal layer is formed between the second surface of the first metal layer and the wiring layer. The first metal layer is formed from a metal selected from gold and silver or from an alloy including at least one of gold and silver. The second metal layer is formed from palladium or a palladium alloy.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE INVENTION

Embodiments will now be described below with reference to the accompanying drawings. The accompanying drawings schematically illustrate structures and do not depict actual scale. Further, insulating layers are not illustrated with hatching lines in the cross-sectional views to facilitate understanding of the cross-sectional structure of each member.

[First Embodiment]

A first embodiment will now be described with reference to FIGS. 1 to 9.

[Wiring Substrate]

First, the structure of the wiring substrate 1 will be described.

Figure 1:
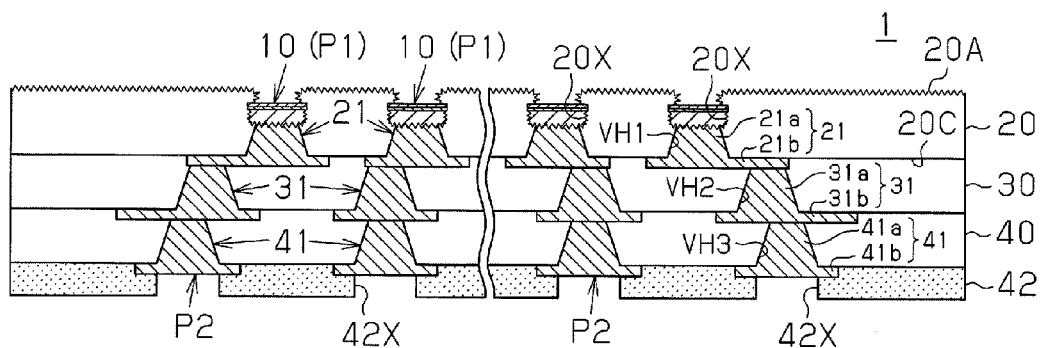
FIG. 1 is a schematic cross-sectional view illustrating a wiring substrate in a first embodiment.

As illustrated in FIG. 1, the wiring substrate 1 includes first to fourth wiring layers 10, 21, 31, and 41 that are laminated with first to third insulating layers 20, 30, and 40 located in between. Via holes VH1, VH2, and VH3 filled with vias 21a, 31a, and 41a are formed in the insulating layers 20, 30, and 40, respectively. In this manner, the wiring substrate 1 of the present embodiment has the form of a "coreless substrate" and does not include a supporting base material. This differs from a wiring substrate manufactured through a typical build-up process in which a wiring substrate includes a desired number of build-up layers sequentially formed on one side or two sides of a core substrate, which serves as a supporting base material.

As the material of the second to fourth wiring layers 21, 31, and 41 (including the vias 21a, 31a, and 41a), metal such as copper, copper alloy, or the like may be used. Further, as the material of the first to third insulating layers 20, 30, and 40, an insulating resin, such as epoxy resin, polyimide resin, or the like may be used.

Figure 2:
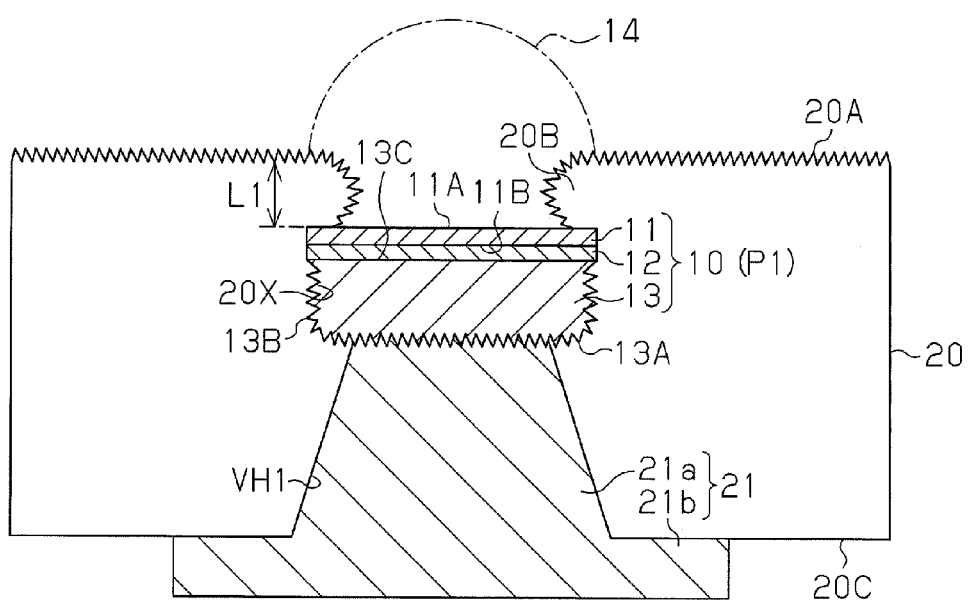
FIG. 2 is an enlarged cross-sectional view illustrating the periphery of a pad of the wiring substrate in the first embodiment.

A first surface 20A (upper surface in the example of FIG. 1) of the first insulating layer 20, which is the outermost layer on one side (upper side in the example of FIG. 1) of the wiring substrate 1, includes recesses 20X, each exposing a pad P1. As illustrated in FIG. 2, a projection 20B projects from a side wall of each recess 20X toward the center of the recess 20X so as to partially cover a main surface 11A of the corresponding pad P1 as viewed from above. Further, the projection 20B has a curved cross-section. The surface of each projection 20B and the first surface 20A of the first insulating layer 20 are roughened so as to include fine peaks and valleys. The roughened surface of the first insulating layer 20 has a surface roughness Ra of, for example, 0.5 to 2 μm. The value of the surface roughness Ra is an arithmetic mean roughness, which is the arithmetic means measured with the absolute values of the height that varies within a measured region from a surface serving as a mean line.

As illustrated in FIG. 1, the first insulating layer 20 includes a second surface 20C that is located opposite to the first surface 20A. A wiring pattern 21b is formed on the second surface 20C of the first insulating layer 20. The third and fourth wiring layers 31 and 41 and the second and third insulating layers 30 and 40 are alternately laminated on the second surface 20C of the first insulating layer 20 in a manner that forms build-up layers.

As illustrated in FIG. 2, each pad P1 has a three-layer structure consisting essentially of a first metal layer 11, a second metal layer 12, and a third metal layer 13. The first metal layer 11 includes a first surface 11A, which is exposed from the recess 20X of the first insulating layer 20, and a second surface 11B, which is located opposite to the first surface 11A. The first surface 11A corresponds to the main surface of the pad P1. The second metal layer 12 is laminated to the second surface 11B of the first metal layer 11. The third metal layer 13 is formed between the second metal layer 12 and the corresponding via 21a. Although not illustrated in the drawings, the pad P1 is, for example, circular when viewed from above.

The first metal layer 11 is formed from a material having good contact properties (soldering properties) so that an electrode terminal (bump etc.) of a semiconductor element (chip) or the like can be bonded by solder 14. The material of the first metal layer 11 is preferably a stable metal that relatively resists oxidization. As the material of the first metal layer 11, a metal such as gold (Au) or silver (Ag) or an alloy including at least one or more of these metals can be used. In the present embodiment, Au is used. The first surface 11A of the first metal layer 11 that is exposed from the first insulating layer 20 is a smooth surface including subtle peaks and valleys. The first surface 11A of the first metal layer 11 has a surface roughness Ra of less than 0.21 μm. From the viewpoint of etching resistance, the first surface 11A of the first metal layer 11 preferably has a surface roughness Ra in the range of 0 μm or greater and less than 0.21 μm, and more preferably, in the range of 0.1 μm or greater and less than 0.21 μm. The first surface 11A of the first metal layer 11 is lustrous or semi-lustrous.

Side surfaces of the first metal layer 11 are covered by the first insulating layer 20. To ensure coverage of the underlying third metal layer 13 while minimizing thickness, the thickness of the first metal layer 11 is preferably in the range of 0.02 to 0.5 μm, and more preferably, in the range of 0.02 to 0.1 μm.

The second metal layer 12 is laminated to the second surface 11B of the first metal layer 11. In other words, the second metal layer 12 is arranged between the first metal layer 11 and the third metal layer 13, thereby functioning to prevent the metal (copper (Cu)) in the third metal layer 13 and the via 21a from being diffused to the first metal layer 11. As the material of the second metal layer 12, palladium (Pd) or a palladium alloy (alloy that does not contain nickel (Ni)) may be used. In the present embodiment, Pd is used. Side surfaces of the second metal layer 12 are covered by the first insulating layer 20. To ensure coverage of the underlying third metal layer 13 while minimizing thickness, the thickness of the second metal layer 12 is preferably in the range of 0.03 to 0.5 μm, and more preferably, in the range of 0.03 to 0.1 μm.

The third metal layer 13 includes a first surface 13A and a second surface 13C, which is located at the side opposite to the first surface 13A and connected to the second metal layer 12. The first surface 13A is directly connected to the via 21a. Thus, the third metal layer 13 is formed from a material having good conductive properties. Further, part of the first surface 13A and a side surface 13B of the third metal layer 13 are covered by the first insulating layer 20. Thus, the material of the third metal layer 13 is preferably a material that ensures adhesion to the first insulating layer 20 (resin). As the material of the third metal layer 13, a metal such as Cu, copper alloy, or the like can be used. Further, the first surface 13A and the side surface 13B of the third metal layer 13 are roughened and include fine peaks and valleys. This increases the adhesiveness between the third metal layer 13 and the first insulating layer 20 compared to when the first surface 13A of the third metal layer 13 is smooth. From the viewpoint of adhesiveness with the first insulating layer 20, the thickness of the third metal layer 13 is preferably in the range of 10 to 20 μm. Such a thickness increases the area of the third metal layer 13 in contact with the first insulating layer 20 and thereby increases adhesiveness with respect to the first insulating layer 20.

The pad P1 is flip-chip connected by the solder 14 to an electrode terminal of a semiconductor element (chip) or the like, which is mounted on the wiring substrate 1. Accordingly, in the present embodiment, the upper surface on which the pad P1 is formed serves as a chip mounting surface.

As illustrated in FIG. 1, the second wiring layer 21 has a via 21a, which is connected to the first surface 13A of the third metal layer 13 of the pad P1, and a wiring pattern 21b, which is connected to the via 21a. The third wiring layer 31 includes the via 31a, which is connected to the wiring pattern 21b, and a wiring pattern 31b, which is connected to the via 31a. The fourth wiring layer 41 includes a via 41a, which is connected to the wiring pattern 31b, and a wiring pattern 41b, which is connected to the via 41a. The vias 21a, 31a, and 41a in the second to fourth wiring layers 21, 31, and 41 each have a tapered shape and a diameter that decreases from the lower side (the side of the wiring pattern 41b) toward the upper side (the side of the pad P1) as viewed in FIG. 1. More specifically, the vias 21a, 31a, and 41a each have the shape of a truncated cone, and the end face facing toward the pad P1 has a smaller diameter than the end face facing toward the wiring pattern 41b.

A solder resist layer 42 is laminated to the third insulating layer 40, which is the outermost layer at the side (lower side in the example of FIG. 1) that is opposite to the surface in which the pads P1 are formed. As the material of the solder resist layer 42, an insulating resin, such as epoxy resin can be used. The solder resist layer 42 includes openings 42X exposing parts of the wiring pattern 41b that serve as external connection pads P2. An external connection terminal, such as a solder ball or a lead pin used to mount the wiring substrate 1 onto a motherboard or the like, is bonded to each external connection pad P2, which is exposed through the solder resist layer 42. More specifically, in the present embodiment, the lower surface including the external connection pads P2 serves as an external connection terminal bonding surface. Although not illustrated in the drawings, each external connection pad P2 has, for example, a circular shape.

[Semiconductor Device]

The structure of a semiconductor device 2 using the wiring substrate 1 will now be described.

Figure 3:
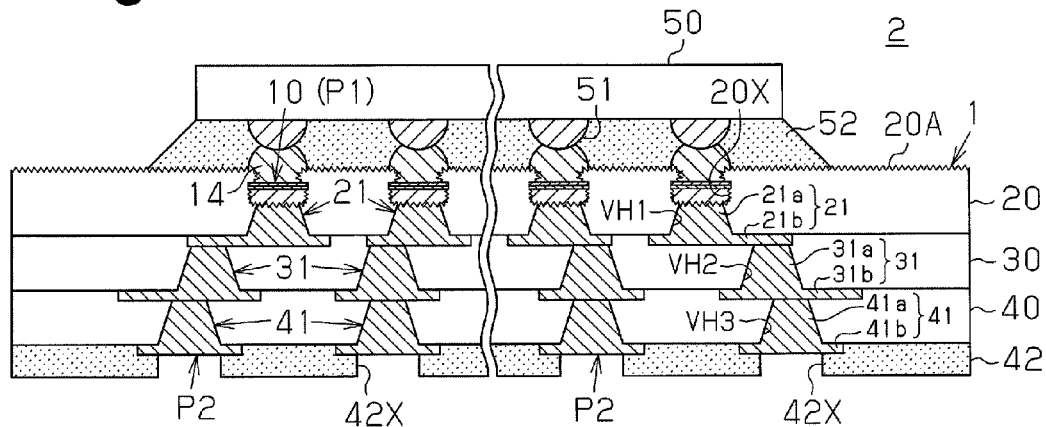
FIG. 3 is a schematic cross-sectional view illustrating a semiconductor device in the first embodiment.

As illustrated in FIG. 3, the semiconductor device 2 includes the wiring substrate 1, a semiconductor element 50, which is flip-chip bonded to the wiring substrate 1, and an underfill resin 52. The solder 14 is formed on the pads P1 of the wiring substrate 1. The solder 14 may be, for example, eutectic solder or Pb-free solder, such as Sn—Ag, Sn—Cu, or Sn—Ag—Cu solder.

In the semiconductor element 50, a plurality of bumps 51 are formed on a circuit formation surface (lower surface as viewed in FIG. 3). The semiconductor element 50 is electrically connected to the pads P1 of the wiring substrate 1 by the bumps 51 and the solder 14.

The underfill resin 52 fills gaps between the wiring substrate 1 and the semiconductor element 50. The underfill resin 52 improves the connection strength of connection portions between the bumps 51 and the pads P1. Further, the underfill resin 52 suppresses the corrosion of the pads P1 and the occurrence of electromigration thereby preventing the reliability of the pads P1 from decreasing. As the material of the underfill resin 52, an insulating resin such as epoxy resin can be used.

[Method for Manufacturing Wiring Substrate]

A method for manufacturing the wiring substrate 1 will now be described.

Figure 4A:
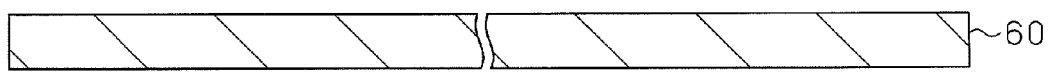
FIGS. 4A to 4D are schematic cross-sectional view illustrating different stages during a manufacturing process of the wiring substrate in the first embodiment.

First, referring to FIG. 4A, a support body 60 is prepared to manufacture the wiring substrate 1. The support body 60 may be, for example, a metal sheet or metal foil. In the present embodiment, copper foil is used as the support body 60. The thickness of this support body 60 is, for example, 35 to 100 μm.

Figure 4B:

Next, referring to FIG. 4B, a roughening process is performed on a main surface 60A (upper surface as viewed in the drawing) of the support body 60 (roughening step). The roughening process is performed so that the main surface 60A of the support body 60 has a surface roughness Ra of 0.5 to 2 μm. This forms fine peaks and valleys in the main surface 60A of the support body 60 and roughens the main surface 60A. Etching, oxidization, plating, blasting, and the like may be performed as the roughening process.

Figure 4C:
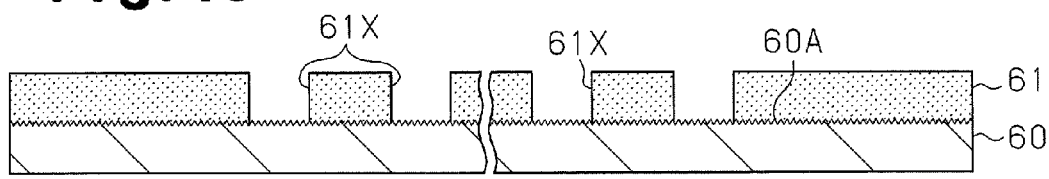

Subsequently, referring to FIG. 4C, a resist layer 61 including openings 61X is formed on the main surface 60A of the support body 60 (resist formation step). The openings 61X expose the main surface 60A of the support body 60 at portions corresponding to regions where the pads P1 (see FIG. 1) are formed. In this case, the main surface 60A of the support body 60 is roughened and ensures adhesion with the resist layer 61.

As the material for the resist layer 61, photosensitive dry film, a liquid photoresist (liquid resist, such as Novolac resin or epoxy resin), or the like may be used. When a photosensitive dry film is used, for example, a dry film is laminated through thermal compression bonding to the main surface 60A of the support body 60, and the dry film is patterned through exposure and development to form the openings 61X in the resist layer 61 in accordance with a predetermined pattern corresponding to the regions where the pads P1 are formed. Similar processing is performed when using a liquid photo resist to form the resist layer 61.

Figure 4D:
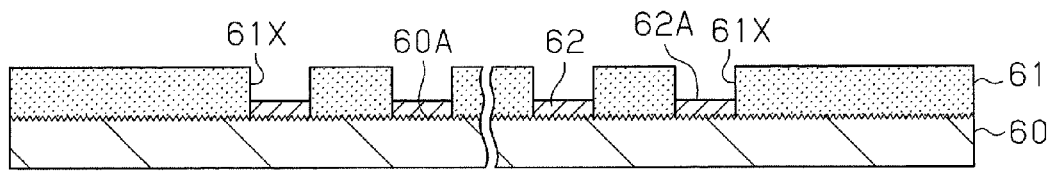

Referring to FIG. 4D, electroplating is then performed on the main surface 60A of the support body 60 using the resist layer 61 as a plating mask and the support body 60 as a plating power supply layer. More specifically, a plating layer 62 including a smooth surface 62A is formed by performing electroplating (in this case, copper electroplating) on the main surface 60A of the support body 60 that is exposed through the openings 61X in the resist layer 61 (smoothening step). As a result, the surfaces on which the pads P1 are formed in a subsequent step become smooth and include subtle peaks and valleys. The surface roughness Ra of the surface 62A of each plating layer 62 is preferably less than 0.21 μm, further preferably, in the range of 0 μm or greater and less than 0.21 μm, and most preferably, in the range of 0.1 μm or greater and less than 0.21 μm. The composition of the plating liquid used for electroplating, the current density, the thickness of the plating layer 62, and the like are adjusted in advance so as to achieve the roughness (smooth surface) described above. As the plating solution for the copper electroplating, a solution obtained by adding an organic component, such as a leveller, polymer or brightener, as an additive to an inorganic component of, for example, copper sulphate, sulphuric acid, and chlorine can be used.

The thickness of the plating layer 62 corresponds to the distance L1 from the upper end of each recess 20X illustrated in FIG. 1 (the first surface 20A of the first insulating layer 20) to the first surface 11A of the first metal layer 11 and is, for example, 10 to 20 μm. The plating layer 62 is formed to have a thickness that is less than the depth of the openings 61X illustrated in FIG. 4D. The plating layer 62 is preferably formed from a material that can be removed together with the support body 60 when the support body 60 is removed in a subsequent step and may be a metal such as copper.

Figure 5A:
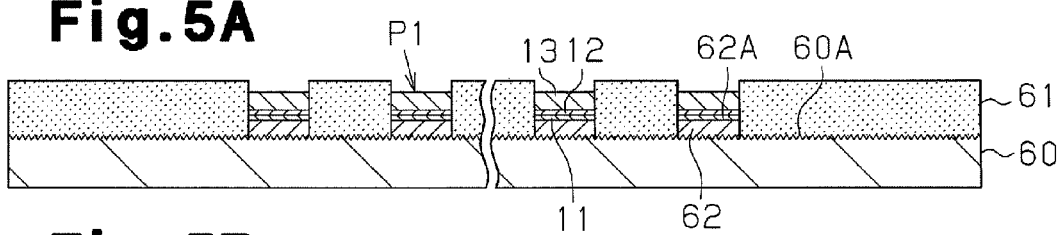
FIGS. 5A, 5C, and 5D are schematic cross-sectional views illustrating different stages during the manufacturing process of the wiring substrate in the first embodiment.
Figure 5B:
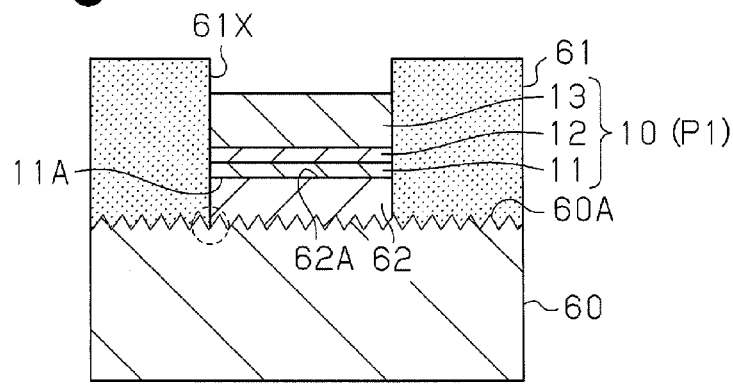
FIG. 5B is an enlarged cross-sectional view illustrating a main part of FIG. 5A.

Next, referring to FIG. 5A, electroplating is performed on the surface 62A of the plating layer 62, using the resist layer 61 as a plating mask. This sequentially forms the first metal layer 11, the second metal layer 12, and the third metal layer 13 on the surface 62A of the plating layer 62. More specifically, referring to FIG. 5B, an Au layer (first metal layer 11) having a thickness of 0.02 to 0.5 μm (preferably, 0.02 to 0.1 μm) is formed by applying an Au flash plating to the surface 62A of the plating layer 62. In this case, the roughened main surface 60A of the support body 60 ensures adhesion between the main surface 60A and the resist layer 61. Further, the surface 62A of the plating layer 62 formed on the main surface 60A is plated. This prevents the plating solution used in the plating process from entering between the support body 60 and the resist layer 61 (refer to portion encircled by broken lines in FIG. 5B). Subsequently, Pd flash plating is performed on the first metal layer 11 to form a Pd layer (second metal layer 12) having a thickness of 0.03 to 0.5 μm (preferably, 0.03 to 0.1 μm). Then, Cu plating is performed on the second metal layer 12 to form a Cu layer (third metal layer 13) having a thickness of 5 to 25 μm (preferably, 10 to 20 μm). The first to third metal layers 11 to 13 form pads P1. In this state, the first surface 11A of the first metal layer 11 is in contact with the surface 62A of the plating layer 62 and shaped in conformance with the surface 62A of the plating layer 62. In other words, the smooth surface 62A is transferred to the first surface 11A of the first metal layer 11. Thus, the first surface 11A of the first metal layer 11 is a smooth surface and includes subtle peaks and valleys. More specifically, the surface roughness Ra of the first surface 11A of the first metal layer 11 is less than 0.21 μm.

Figure 5C:
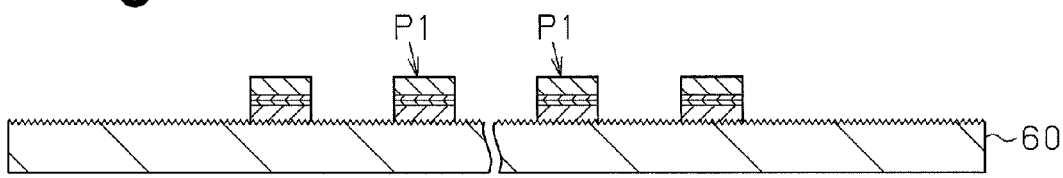

Subsequently, referring to FIG. 5C, the resist layer 61 that has been used as the plating resist is removed. For example, if a dry film has been used as the material of the resist layer 61, an alkaline chemical solution, such as sodium hydroxide, monoethanol amine, may be used to remove the resist layer 61. If a liquid resist such as Novalac resin or epoxy resin has been used as the material of the resist layer 61, acetone, alcohol, or the like may be used to remove the resist layer 61.

Figure 5D:
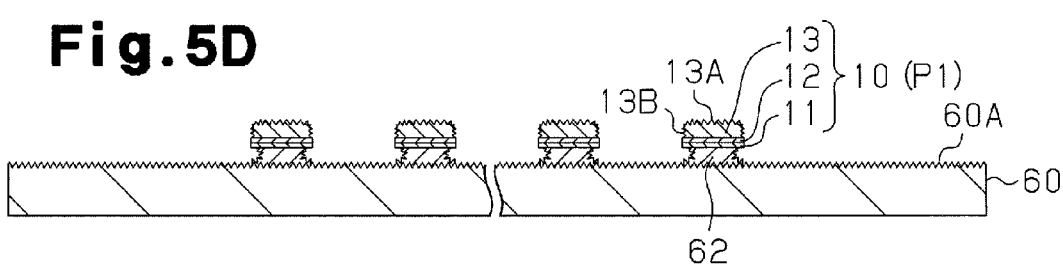
Figure 6A:
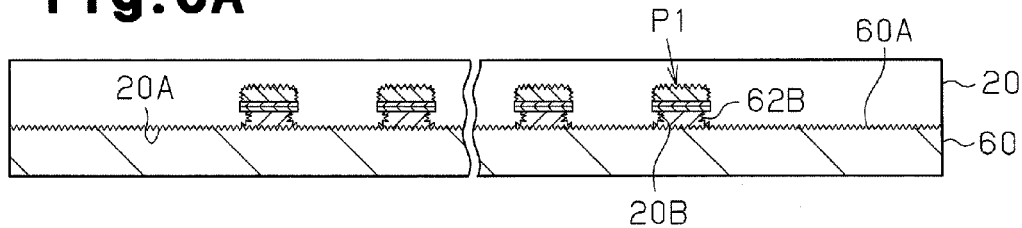
FIGS. 6A to 6E are schematic cross-sectional view illustrating different stages during the manufacturing process of the wiring substrate in the first embodiment.

Next, referring to FIG. 5D, a roughening process is performed on the first surface 13A and the side surfaces 13B of the third metal layer 13 (roughening step). The roughening process is performed so that the surface roughness Ra of the first surface 13A of the third metal layer 13 is 0.5 to 2 μm. The roughening process roughens the first surface 13A and the side surfaces 13B of the third metal layer 13 by forming fine peaks and valleys in the first surface 13A and the side surfaces 13B. This process is performed to improve adhesion of the first insulating layer 20 with the third metal layer 13 in the subsequent step, which is illustrated in FIG. 6A. The roughening process may employ, for example, anisotropic etching (such as wet etching). In the roughening process, the main surface 60A of the support body 60, which is formed from copper, is also roughened in the same manner as the third metal layer 13.

Figure 5E:
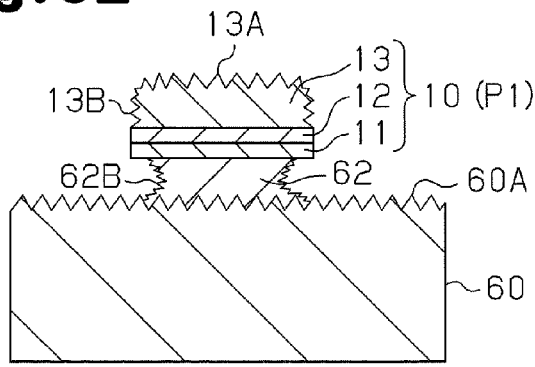
FIG. 5E is an enlarged cross-sectional view illustrating a main part of FIG. 5D.

When performing anisotropic etching, the etching proceeds in a horizontal direction rather than a perpendicular direction with respect to the mask (the first and second metal layers 11, 12). Thus, as illustrated in FIG. 5E, the side walls 62B of the plating layer 62, which is formed from copper, are also etched (side etched, undercut) in the same manner as the third metal layer 13. Consequently, the side walls 62B of the plating layer 62 are partially removed and recessed into an inwardly curved shape when roughened to include fine peaks and valleys. This forms a so-called overhang structure in which the edges of the first and second metal layers 11 and 12 project outward from the underlying plating layer 62. In this manner, the roughening process is performed to etch the first surface 13A and the side surfaces 13B of the third metal layer 13, the main surface 60A of the support body 60, and the side walls 62B of the plating layer 62.

In the roughening process, conditions, such as the etching solution, are set so as to selectively etch the third metal layer 13 and the plating layer 62 from the first and second metal layers 11 and 12 without roughening the surfaces of the first metal layer 11, which is formed from Au, and the second metal layer 12, which is formed from Pd. Consequently, the first metal layer 11 and the second metal layer 12 are not affected by the roughening process, and the surfaces of the metal layers 11 and 12 are not roughened.

Then, referring to FIG. 6A, the first insulating layer 20 is formed on the main surface 60A of the support body 60 to cover the pads P1. The first insulating layer 20 is formed to enter portions under the first metal layer 11. This forms the projections 20B, which partially cover the corresponding pads P1. The projections 20B are in contact with the side walls 62B of the plating layer 62 and are thus shaped in conformance with the side walls 62B. In other words, the shapes of the side walls 62B are transferred to the projections 20B. Thus, the projections 20B are formed to project into the plating layer 62 with curved shapes and include fine peaks and valleys. Further, the shape of the main surface 60A of the support body 60 is transferred to the first surface 20A of the first insulating layer 20, which is in contact with the main surface 60A of the support body 60. This forms fine peaks and valleys in the first surface 20A.

The first insulating layer 20 can be formed by laminating a resin film onto the support body 60, and then curing the resin by performing a heat treatment under a temperature of about 130° C. to 150° C. while applying pressure to the resin film.

Subsequently, referring to FIG. 6B, the via holes VH1 are formed at predetermined locations in the first insulating layer 20 to expose the first surface 13A of the third metal layer 13. The via holes VH1 can be formed by performing laser processing using a $CO_2$ gas laser, an excimer laser, or the like. When the first insulating layer 20 is formed from a photosensitive resin, photolithography may be performed to obtain the required via holes.

Figure 6B:
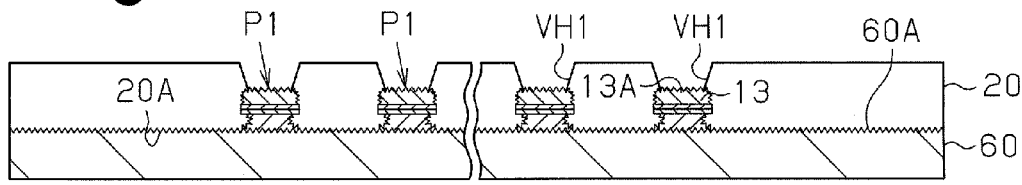
Figure 6C:
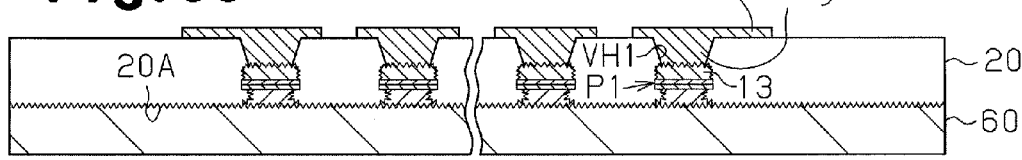

Then, referring to FIG. 6C, the vias 21a are formed by filling a via conductor into the via holes VH1 of the first insulating layer 20. Further, the wiring pattern 21b, which is connected by the vias 21a to the pads P1 (third metal layer 13), is formed on the second surface 20C of the first insulating layer 20. A semi-additive process may be performed to form the vias 21a and the wiring pattern 21b, that is, the second wiring layer 21.

More specifically, electroless plating, sputtering, or the like is performed to form a Cu seed layer (not illustrated) on the second surface 20C of the first insulating layer 20 including the wall surfaces of the via holes VH1. Then, a resist layer (not illustrated) including openings conforming to the shape of the wiring pattern 21b is formed. Subsequently, Cu electroplating is performed on the seed layer, which is exposed through the openings of the resist layer, to form a conductor pattern by using the seed layer as a power supply layer. Then, after removing the resist layer, the seed layer is etched using the conductor pattern as a mask to form the second wiring layer 21.

To form the second wiring layer 21, various wire forming processes, such as a subtractive process, may be employed in addition to the semi-additive process described above.

Then, the steps illustrated in FIG. 6A to FIG. 6C are repeated to alternately laminate insulating layers and wiring layers. More specifically, referring to FIG. 6D, the insulating layer 30 is formed on the insulating layer 20 and the wiring layer 21, the via holes VH2 are formed in the insulating layer 30 and extend to the surface of the wiring pattern 21b, the vias 31a are formed in the via holes VH2, and the wiring pattern 31b connected to the vias 31a is formed. Then, the insulating layer 40 is formed on the insulating layer 30 and the wiring layer 31, the via holes VH3 are formed in the insulating layer 40 and extend to the surface of the wiring pattern 31b, the vias 41a are formed in the via holes VH3, and the wiring pattern 41b connected to the vias 41a is formed.

Figure 6D:
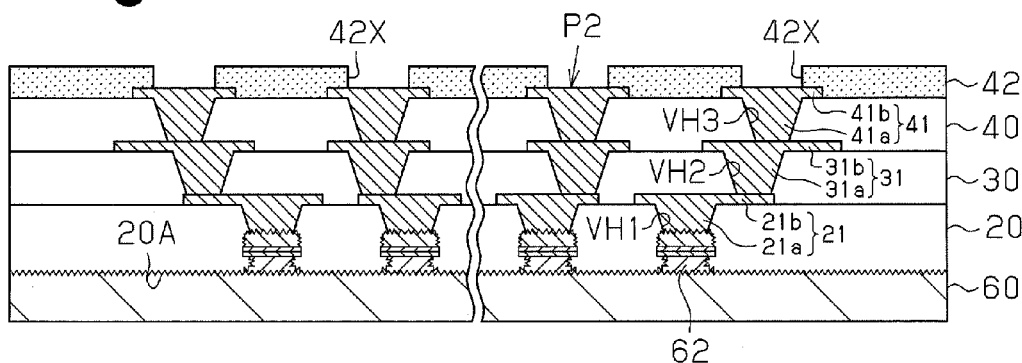

Then, referring to FIG. 6D, the solder resist layer 42, which includes the openings 42X that expose the pads P2 arranged at predetermined locations of the fourth wiring layer 41, is formed on the insulating layer 40 and the wiring layer 41. The solder resist layer 42 can be formed by laminating a photosensitive solder resist film or applying a liquid solder resist and then patterning the resist into the required shape. This exposes portions of the fourth wiring layer 41 through the openings 42X in the solder resist layer 42 as the pads P2. A metal layer formed from Pd and a metal layer formed from Au or Ag may be sequentially laminated onto the pads P2. Electroless plating can be performed to form the metal layers.

Figure 6E:
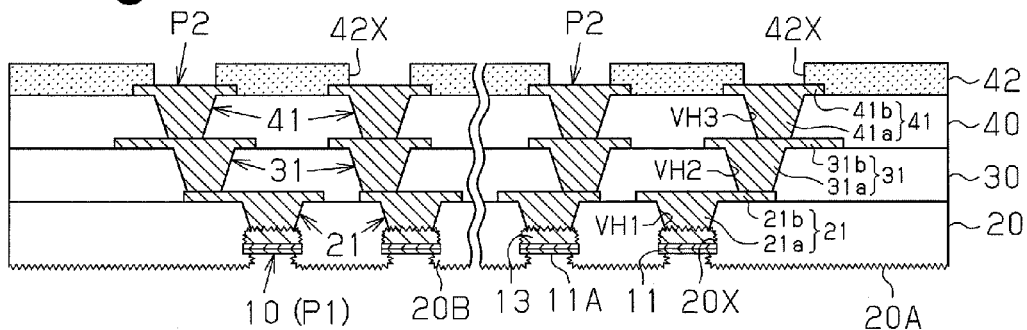

Then, referring to FIG. 6E, the support body 60, which has been used as a provisional substrate, and the plating layer 62 are removed (removal step). For example, when copper foil is used as the support body 60 and the plating layer 62 is formed from Cu, the support body 60 and the plating layer 62 can be removed by performing wet etching using an aqueous iron (II) oxide solution, an aqueous copper (II) oxide solution, an aqueous ammonium persulfate solution, or the like. The removal step forms the recesses 20X in the first insulating layer 20, and the recesses 20X expose the pads P1 from the first insulating layer 20. In the removal step, the first surface 11A of the first metal layer 11 is a smooth surface and have good coating properties. Thus, etching solution does not enter the third metal layer 13, and pinholes are not produced. Further, the edges of the pads P1 (first metal layer 11) from which etching solution is liable to enter are covered by the projections 20B of the first insulating layer 20. This suppresses the entry of the etching solution from the edges and prevents etching of the third metal layer 13. In the removal step, the first metal layer 11, which is formed from Au is formed on the outermost surface of the pads P1. Thus, selective etching can be performed on the pads P1 and the first insulating layer 20 to remove the support body 60 and the plating layer 62.

The manufacturing process described above manufactures the wiring substrate 1 of the present embodiment.

[Method for Manufacturing Semiconductor Device]

Next, a method for manufacturing a semiconductor device 2 using the wiring substrate 1 will be described.

Figure 7A:
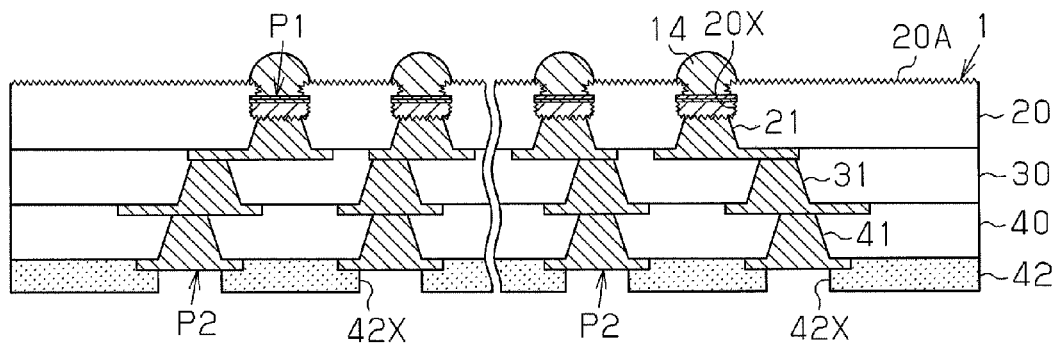
FIG. 7A to FIG. 7C are schematic cross-sectional views illustrating different stages during the manufacturing process of the semiconductor device in the first embodiment.
Figure 7B:
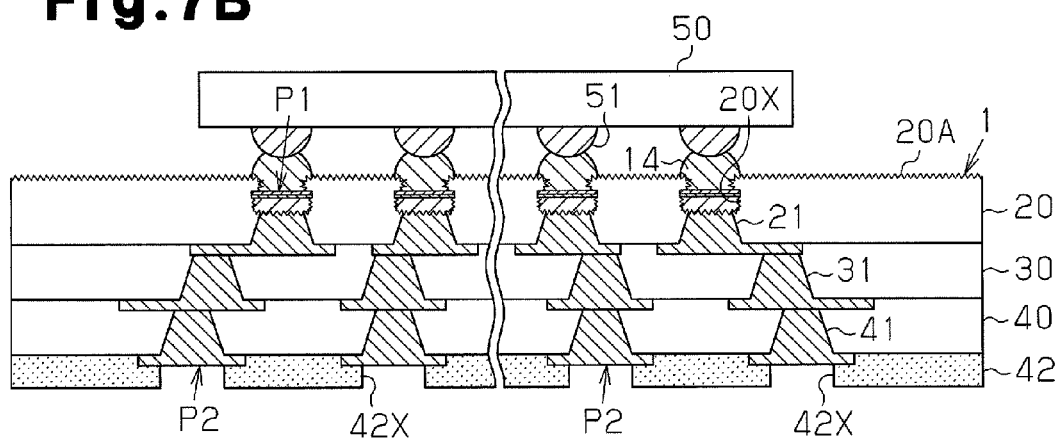
Figure 7C:
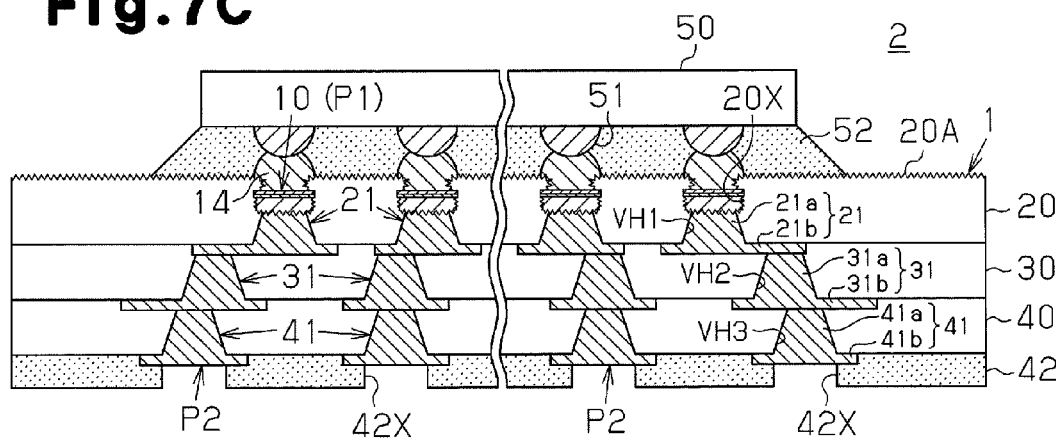

First, as illustrated in FIG. 7A, the solder 14 is formed on the pads P1 of the wiring substrate 1. The solder 14 can be formed by applying solder paste or by mounting solder balls. Then, as illustrated in FIG. 7B, the semiconductor element 50 is positioned so that its bumps 51, which are arranged on terminals, are aligned with the pads P1. In this state, the solder 14 and the bumps 51 are melted thereby electrically connecting the semiconductor element 50 and the pads P1 (flip-chip bonding). Referring to FIG. 7C, the liquid underfill resin 52 is filled between the semiconductor element 50 and the first insulating layer 20 of the wiring substrate 1 and cured. The manufacturing process described above manufactures the semiconductor device 2 of the present embodiment.

[Pad Etching Resistance Evaluation]

Figure 8:
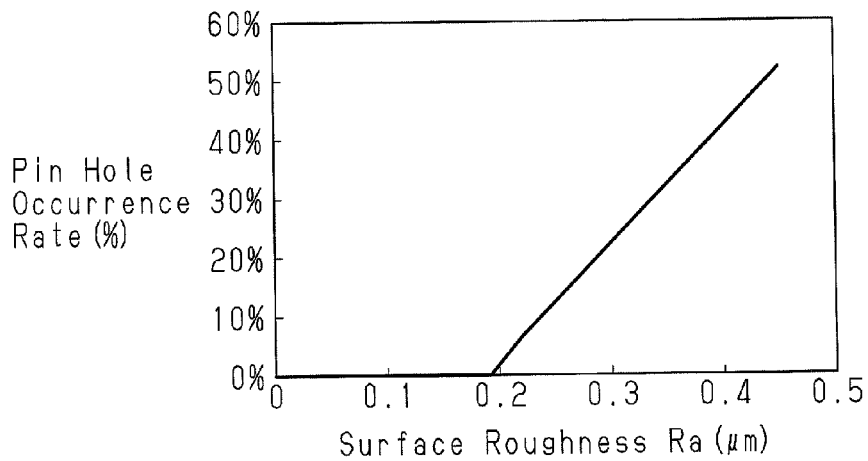
FIG. 8 is a graph illustrating the relationship between the surface roughness and the etching resistance.
Figure 9A:
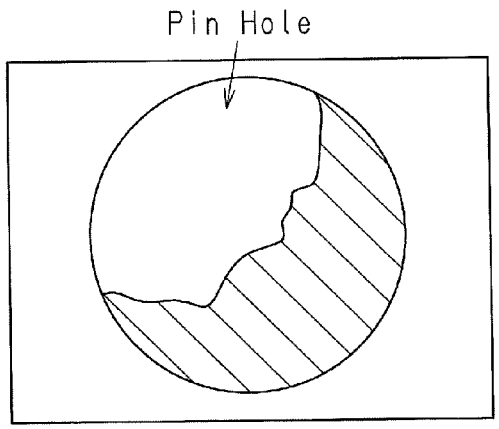
FIGS. 9A and 9B are diagrams illustrating a pinhole.
Figure 9B:
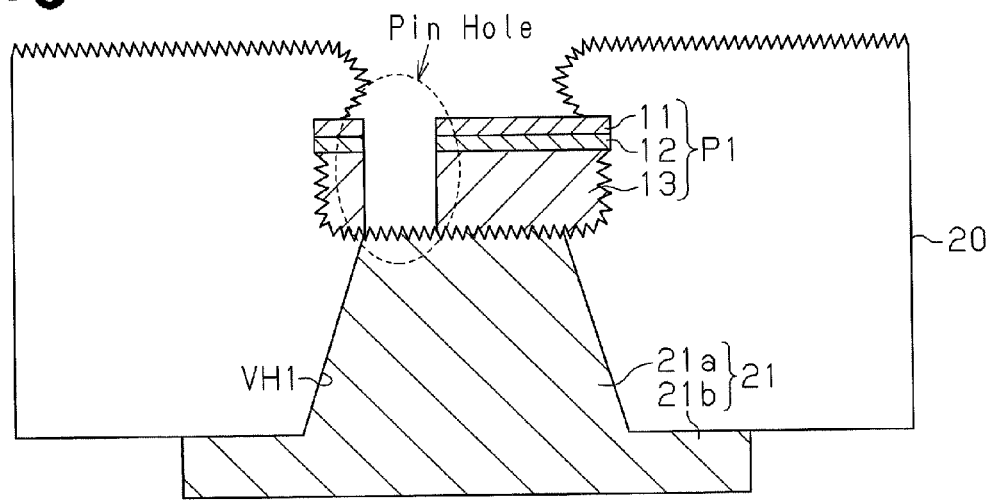

The evaluation of the relationship between the surface roughness of the first surface 11A of the first metal layer 11, which contacts the plating layer 62 removed in the removal step of FIG. 6E, and the etching resistance. FIG. 8 illustrates how the etching resistance (pinhole occurrence rate) of the pads P1 changes when varying the roughness of the first surface 11A of the first metal layer 11. More specifically, the step of FIG. 6E, which is a Cu etching step for removing the support body 60 and the plating layer 62, is performed a number of times (here, three times) on the structure obtained in the step of FIG. 6D. Then, the etching resistance is evaluated by measuring the pinhole occurrence rate as illustrated in FIG. 9A and FIG. 9B.

As apparent from the results illustrated in FIG. 8, as the surface roughness Ra of the first surface 11A of the first metal layer 11 decreases, the pinhole occurrence rate decreases and the etching resistance of the pads P1 increases. It is believed that this is because the coating properties (step coverage) of the first metal layer 11 and the second metal layer 12 improves as the surface roughness Ra value of the first surface 11A of the first metal layer 11 decreases. Further, it is apparent that when the surface roughness Ra of the first surface 11A of the first metal layer 11 is less than 0.21 μm, the pinhole occurrence rate becomes extremely low (5% or less). Accordingly, when the surface roughness Ra of the first surface 11A of the first metal layer 11 is less than 0.21 μm, good etching resistance can be obtained and the occurrence of pinholes in the pads P1 during the removal step of FIG. 6E can be suppressed. In other words, by setting the surface roughness Ra of the first surface 11A of the first metal layer 11 to less than 0.21 μm, the first metal layer 11 and second metal layer 12 can function as barrier films that prevent etching of the third metal layer 13, the second wiring layer 21, and the like in the removal step of FIG. 6E.

As the surface roughness Ra value of the first surface 11A in first metal layer 11 increases, the coating properties (step coverage) of the first metal layer 11 and the second metal layer 12 deteriorates. It can thus be assumed that this produces pinholes, such as that illustrated in FIG. 9, in the first metal layer 11 and the second metal layer 12. More specifically, the etching solution used to etch the Cu enters the third metal layer 13 from the pinholes in the first metal layer 11 and second metal layer 12 and etches the third metal layer 13.

The wiring substrate 1 and method for manufacturing the wiring substrate 1 in the first embodiment have the advantages described below.

(1) Each pad P1 has a three-layer structure consisting essentially of the first metal layer 11 (Au layer), the second metal layer 12 (Pd layer), and the third metal layer 13 (Cu layer). Since the layer structure of the pad P1 does not include Ni, the drop impact resistance does not decrease even when lead-free solder is used to form the pads P1. Further, the first metal layer 11 of highly stable Au is formed as the outermost layer of the pads P1. This suppresses oxidization and discoloration of the surface of the pads P1 and the second metal layer 12 and the third metal layer 13. Further, the second metal layer 12, which is formed from Pd having superior barrier properties, is arranged between the first metal layer 11, which is formed from Au, and the third metal layer 13, which is formed from Cu. This suppresses mutual diffusion of Au and Cu that would be caused by heat.

(2) The first surface 11A of the first metal layer 11 is formed to be a smooth surface including subtle peaks and valleys. This improves the coating properties of the first metal layer 11 and second metal layer 12 and increases the etching resistance. Accordingly, the occurrence of pinholes in the pads P1 is suppressed, for example, in the removal step of FIG. 6E. Further, the improvement in the coating properties of the first metal layer 11 and second metal layer 12 also improve the chemical resistance and solder connectivity.

(3) The projections 20B, which cover parts of the pads P1 (i.e., edges of the pads), are formed in the first insulating layer 20. This increases adhesion between the pads P1 and the first insulating layer 20. Thus, the tensile strength is increased when the bumps 51 of the semiconductor element 50 or external connection terminals (solder balls, pins, etc.) are bonded to the pads P1. This suppresses the separation of the pads P1 from the wiring substrate 1.

(4) The plating layer 62 includes the smooth surface 62A, the first metal layer 11 is formed on the surface 62A, and the first metal layer 11 is formed with the smooth first surface 11A. Further, after etching the side walls 62B of the plating layer 62, the first insulating layer 20 is formed to cover the side walls 62B. This forms the projections 20B in the first insulating layer 20. Further, the projections 20B are formed during the removal step of FIG. 6E. This prevents etching solution from entering the third metal layer 13 from the edges of the pads P1 (first metal layer 11). Accordingly, etching of the third metal layer 13 can be suppressed in a desirable manner.

[Second Embodiment]

A second embodiment will now be described with reference to FIGS. 10 to 15. Like or same reference numerals are given to those components that are the same as the corresponding components illustrated in FIGS. 1 to 9. Such components will not be described in detail.

[Wiring Substrate]

First, the structure of the wiring substrate 3 will be described.

Figure 10:
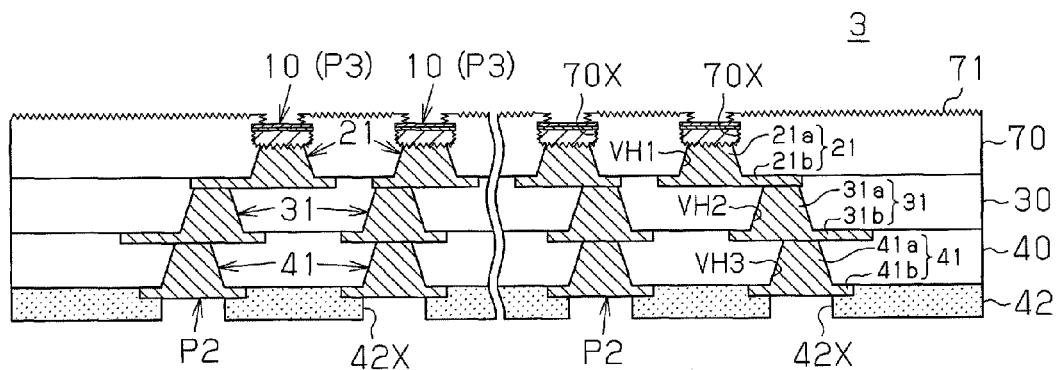
FIG. 10 is a schematic cross-sectional view illustrating a wiring substrate in a second embodiment.

As illustrated in FIG. 10, the wiring substrate 3 includes first to fourth wiring layers 10, 21, 31, and 41 that are laminated with first to third insulating layers 70, 30, and 40 in between. Via holes VH1, VH2, and VH3 are formed in the insulating layers 70, 30, and 40 and filled with vias 21a, 31a, and 41a. Like the wiring substrate 1 of the first embodiment, the wiring substrate 3 of the present embodiment is a "coreless substrate" that does not include a supporting base material.

Figure 11:
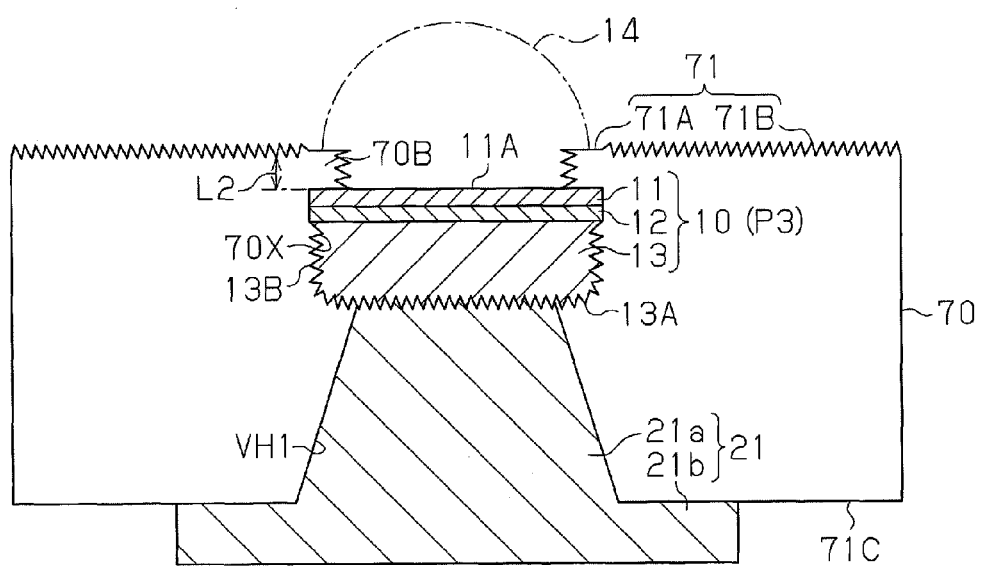
FIG. 11 is an enlarged cross-sectional view illustrating the periphery of a pad of the wiring substrate in the second embodiment.

Recesses 70X, which expose the pads P3, are formed on a first insulating layer 70, which is the outermost layer on one side of the wiring substrate 3 (upper side in the example of FIG. 10). As illustrated in FIG. 11, a projection 70B, which projects toward the center of the recess 70X, is formed by part of the side wall of the recess 70X, so as to partially cover the main surface of each pad P3, that is, the first surface 11A of the first metal layer 11 as viewed from above. The surface of the projection 70B is roughened to include fine valleys and peaks. The projection 70B is set to have, for example, a surface roughness Ra of 0.5 to 2 μm. Although not illustrated, the recess 70X is circular when viewed from above. Thus, pad P3 is also circular when viewed from above. The first insulating layer 70 includes a first surface 71 (upper surface in the example of FIG. 11) and a second surface 71C that is located opposite to the first surface 71. The wiring pattern 21b is formed on the second surface 71C. The first surface 71 includes a flat surface 71A and a rough surface 71B. The flat surface 71A is formed in the periphery of the side wall of each recess 70X and includes only a small amount of peaks and valleys. The rough surface 71B is formed in portions excluding the flat surface 71A and includes fine peaks and valleys. More specifically, the flat surface 71A is formed on the upper surface of each projection 70B that partially covers the corresponding pad P3. In the present embodiment, solder 14 is formed on the flat surface 71A. The surface roughness Ra of the flat surface 71A is, for example, 0.3 to 0.4 μm. The surface roughness Ra of the rough surface 71B is, for example, 0.5 to 2 μm.

[Semiconductor Device]

The structure of a semiconductor device 4 using the wiring substrate 3 will now be described.

Figure 12:
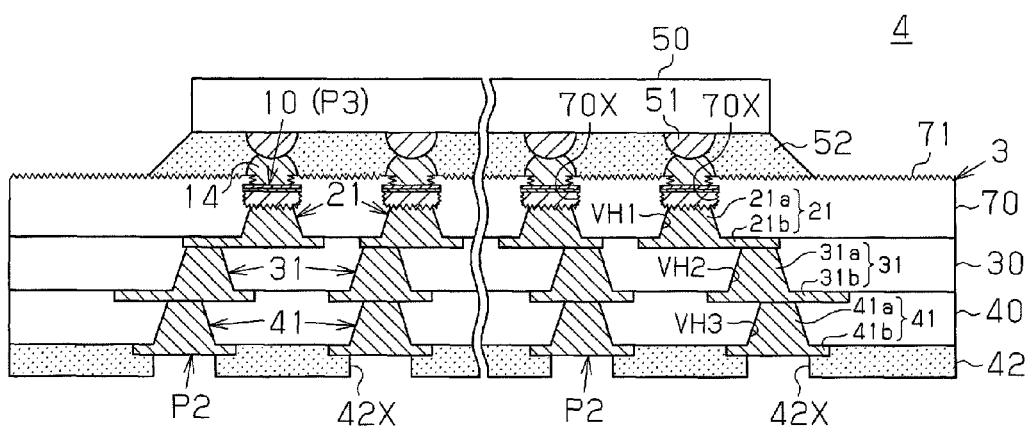
FIG. 12 is a schematic cross-sectional view illustrating a semiconductor device in the second embodiment.

As illustrated in FIG. 12, the semiconductor device 4 includes the wiring substrate 3, a semiconductor element 50, which is flip-chip bonded to the wiring substrate 3, and an underfill resin 52. The solder 14 is formed on each pad P3 of the wiring substrate 3.

The semiconductor element 50 is electrically connected to the pads P3 of the wiring substrate 3 by bumps 51 and the solders 14. The underfill resin 52 fills gaps between the wiring substrate 3 and the semiconductor element 50.

[Method for Manufacturing Wiring Substrate]

A method for manufacturing the wiring substrate 3 will now be described.

Figure 13A:
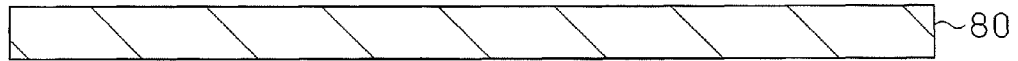
FIGS. 13A to 13D and 13F are schematic cross-sectional views illustrating different stages during a manufacturing process of the wiring substrate in the second embodiment.

First, referring to FIG. 13A, a support body 80 is prepared to manufacture the wiring substrate 3. The support body 80 may be, for example, a metal sheet or metal foil. In the present embodiment, copper foil is used as the support body 80. The thickness of the support body 80 is, for example, 35 to 100 μm.

Figure 13B:
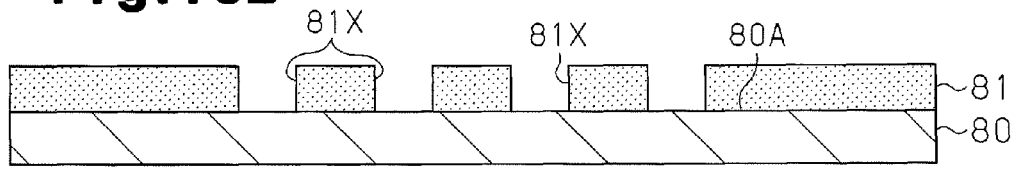

Then, referring to FIG. 13B, a resist layer 81, which includes openings 81X, is formed on the main surface 80A of the support body 80 (resist formation step). The openings 81X are formed to expose the main surface 80A of the support body 80 at portions corresponding to where the pads P3 (refer to FIG. 10) are formed.

As the material of the resist layer 81, a photosensitive dry film, a liquid photoresist (liquid resist such as Novolac resin or epoxy resin), or the like may be used. When a photosensitive dry film is used, for example, the dry film is then laminated through thermal compression bonding to the main surface 80A of the support body 80, and the dry film is patterned through exposure and development to form the openings 81X in the resist layer 81 with a predetermined pattern corresponding to the regions where the pads P3 are formed. Similar processing is performed when using a liquid photo resist to form the resist layer 81.

Figure 13C:
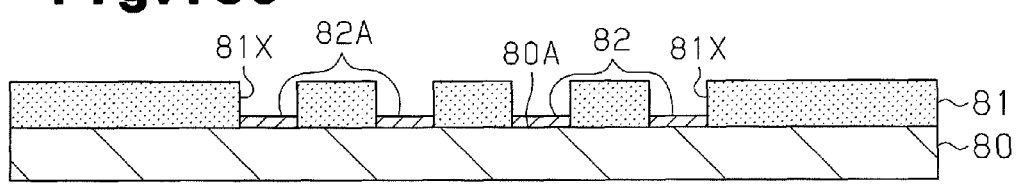

Then, referring to FIG. 13C, electroplating is performed on the main surface 80A of the support body 80 using the resist layer 81 as a plating mask and the support body 80 as a plating power supply layer. More specifically, electroplating is performed on the main surface 80A of the support body 80 exposed through the openings 81X of the resist layer 81 to form a plating layer 82 including a smooth surface 82A (smoothening step). As a result, the surfaces on which the pads P3 are formed in a subsequent step become smooth and include subtle peaks and valleys. The surface roughness Ra of the surface 82A of the plating layer 82 is preferably less than 0.21 μm, more preferably, in the range of 0 μm or greater and less than 0.21 μm, and most preferably, in the range of 0.1 μm or greater and less than 0.21 μm. In other words, the composition of the plating liquid used for electroplating, the current density, the thickness of the plating layer 82, and the like are adjusted in advance so as to obtain such roughness. As the plating solution for the electroplating, a solution obtained by adding an organic component, such as a leveller, polymer or brightener, as an additive to an inorganic component, such as copper sulphate, sulphuric acid, and chlorine, may be used.

The thickness of the plating layer 82 corresponds to the distance L2 from the upper end of the recess 70X illustrated in FIG. 11 (the first surface 71 of the first insulating layer 70) to the first surface 11A of the first metal layer 11 and is, for example, 5 to 20 µm. The plating layer 82 is formed to have a thickness that is less than the depth of the openings 81X illustrated in FIG. 13C. In the present embodiment, the smooth plating layer 82 is formed on the non-roughened support body 80. Thus, compared to when forming a smooth-surfaced plating layer on the roughened support body 80, the surface of the plating layer 82 includes subtle peaks and valleys even though the plating layer 82 is thin.

The material of the plating layer 82 is preferably a material that can be removed together with the support body 80 when the support body 80 is removed in a subsequent step. This material may be a metal such as copper.

Figure 13D:
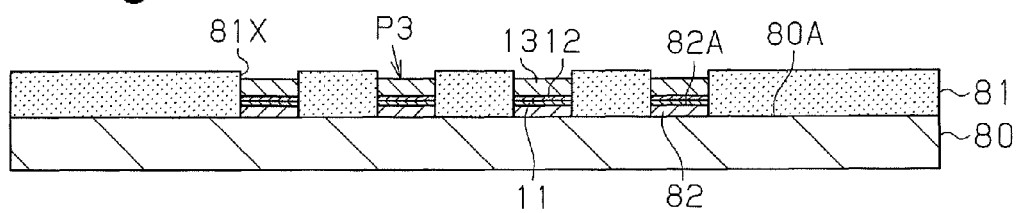
Figure 13E:
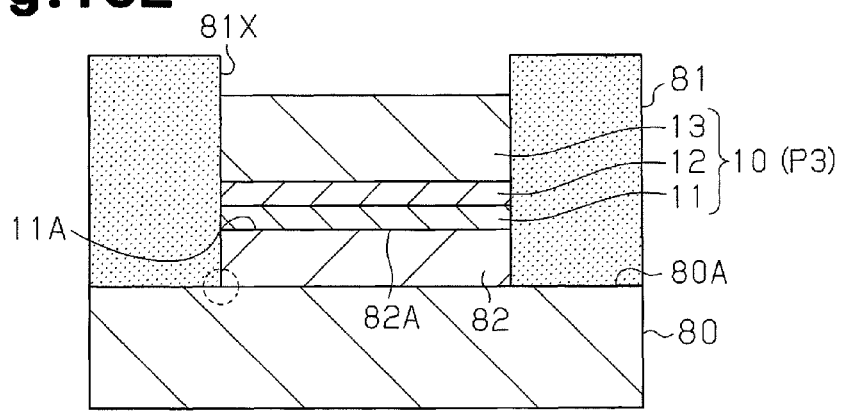
FIG. 13E is an enlarged cross-sectional view illustrating a main part of FIG. 13D.

Next, referring to FIG. 13D, electroplating is performed on the surface 82A of the plating layer 82 using the resist layer 81 as a plating mask to sequentially laminate the first metal layer 11, second metal layer 12, and third metal layer 13 on the surface 82A of the plating layer 82 (pad formation step). The first to third metal layers 11 to 13 form the pads P3. Referring to FIG. 13E, the first surface 11A of the first metal layer 11 contacts the surface 82A of the plating layer 82 and is shaped in conformance with the surface 82A of the plating layer 82. That is, the smooth surface 82A is transferred to the first surface 11A of the first metal layer 11. Thus, the first surface 11A of the first metal layer 11 is smooth and include subtle peaks and valleys. More specifically, the surface roughness Ra of the first surface 11A of the first metal layer 11 is less than 0.21 µm. In the step of forming the first metal layer 11, a plating process is performed on the surface 82A of the plating layer 82, which has been formed on the main surface 80A of the support body 80. This prevents a plating solution or the like used in the process from entering between the support body 80 and the resist layer 81 (see the portion encircled by broken lines in FIG. 13E).

Figure 13F:
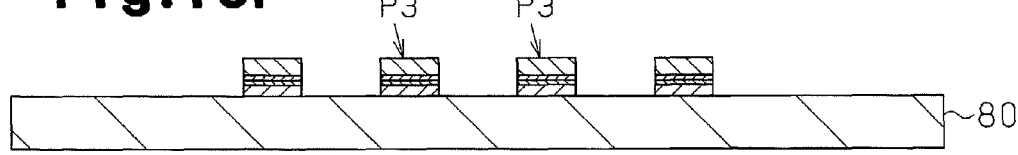
Figure 14A:
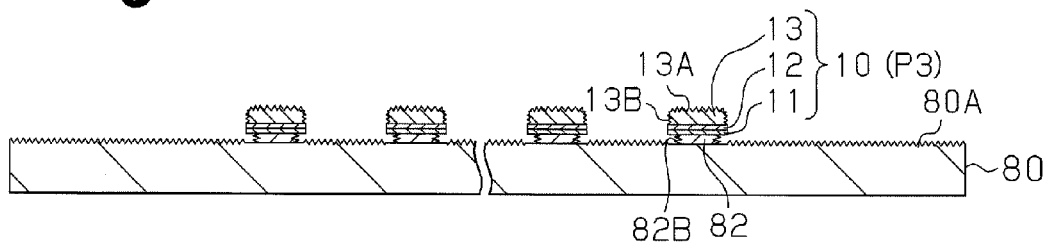
FIGS. 14A and 14C to 14E are schematic cross-sectional views illustrating different stages during the manufacturing process of the wiring substrate in the second embodiment.
Figure 14B:
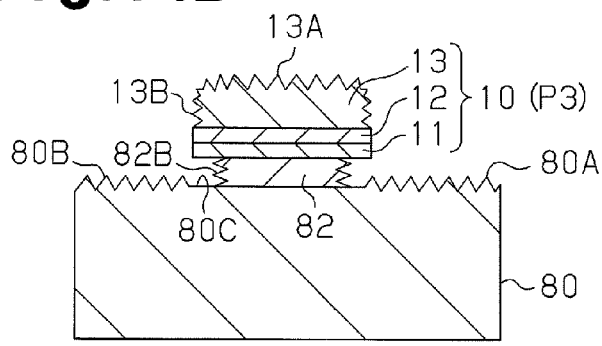
FIG. 14B is an enlarged cross-sectional view illustrating a major part of FIG. 14A.

Subsequently, referring to FIG. 13F, the resist layer 81, which has been used as the plating mask, is removed. Then, as illustrated in FIG. 14A, a roughening process is performed on the first surfaces 13A and side surfaces 13B of the third metal layer 13, the main surface 80A of the support body 80, and side walls 82B of the plating layer 82. The roughening process is performed so that the surface roughness Ra of the first surfaces 13A and side surfaces 13B of the third metal layer 13, the main surface 80A of the support body 80, and the side walls 82B of the plating layer 82 becomes 0.5 to 2 µm. The roughening process can employ, for example, anisotropic etching (such as wet etching). As illustrated in FIG. 14B, the roughening process roughens the first surfaces 13A and side surfaces 13B of the third metal layer 13 by forming fine peaks and valleys in the first surfaces 13A and the side surfaces 13B. Further, each side wall 82B of the plating layer 82 is partially removed to form a recess that is inwardly curved, while roughening the side wall 82B by forming fine peaks and valleys. This obtains an overhang structure in which the edges of the upper first and second metal layers 11 and 12 project outward beyond the underlying plating layer 82. Further, a rough surface 80B is obtained by forming fine peaks and valleys in the main surface 80A of the support body 80. However, when there is a post (here, the plating layer 82) during etching, etching proceeds slowly in the periphery of the post. Thus, the main surface 80A of the support body 80 exposed by removing part of the plating layer 82 is mostly not roughened. This non-roughened surface (hereinafter referred to as the flat surface 80C) has a surface roughness Ra of, for example, 0.3 to 0.4 µm, which is about the same as the main surface 80A of the support body 80 prior to roughening.

In the roughening process, the conditions, such as the etching solution, are set to selectively etch the third metal layer 13, the support body 80 and the plating layer 82, without roughening the surfaces of the first metal layer 11, which is formed from Au, and the second metal layer 12, which is formed from Pd. Consequently, the first metal layer 11 and the second metal layer 12 are not affected by the roughening process, and the surfaces of the metal layers 11, 12 are not roughened.

Figure 14C:
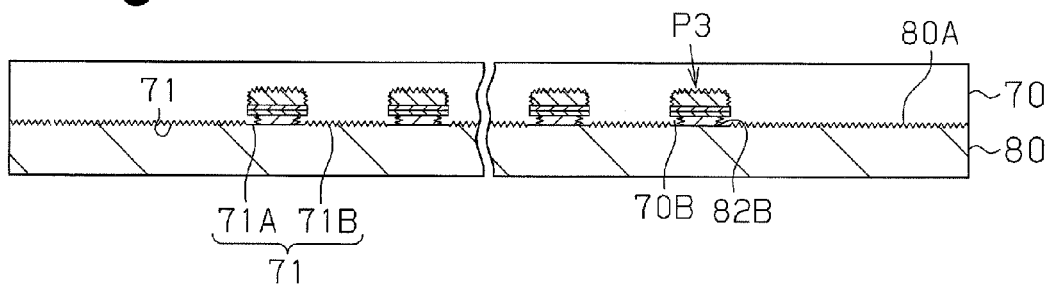

Then, referring to FIG. 14C, a first insulating layer 70 is formed on the main surface 80A of the support body 80 to cover the pads P3. Portions of the first insulating layer 70 enter the gaps below the first metal layer 11. This forms the projections 70B that partially cover the pads P3. The projections 70B are in contact with the side walls 82B of the plating layer 82 and are shaped in conformance with the side walls 82B. In other words, the shapes of the side walls 82B are transferred to the projections 70B. Thus, the projections 70B project into the plating layers 82 and include fine peaks and valleys. Further, the shape of the main surface 80A of the support body 80 is transferred to the first surface 71 of the first insulating layer 70, which is in contact with the main surface 80A of the support body 80. Thus, flat surfaces 71A shaped in conformance with the flat surfaces 80C of the support body 80 are formed in the first surface 71 of the first insulating layer 70, which correspond to the upper surfaces of the projections 70B. Further, rough surfaces 71B shaped in conformance with the rough surface 80B of the support body 80 is formed in the first surface 71 of the first insulating layer 70 at portions excluding the flat surface 71A. The surface roughness Ra of the flat surface 71A is, for example, 0.3 to 0.4 µm, and the surface roughness Ra of the rough surface 71B is, for example, 0.5 to 2 µm.

The following steps are performed in the same manner as the first embodiment and thus will be described briefly.

Figure 14D:
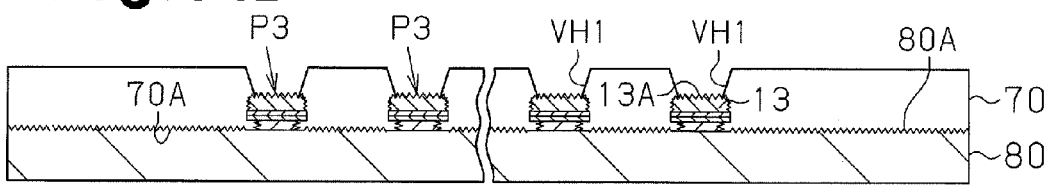

Referring to FIG. 14D, via holes VH1 are formed at predetermined locations in the first insulating layer 70 to expose the first surface 13A of the third metal layer 13. Then, the vias 21a are formed by filling the via holes VH1 with a via conductor. Further, a wiring pattern 21b connected by the vias 21a to the pads P3 is formed on the first insulating layer 70.

Figure 14E:
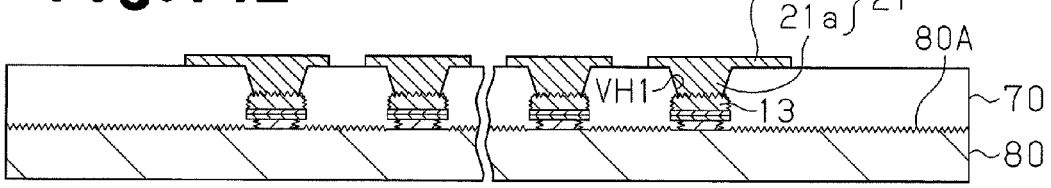

Then, the steps of FIGS. 14C to 14E are repeated to alternately laminate insulating layers and wiring layers. More specifically, referring to FIG. 15A, the insulating layer 30 is formed on the insulating layer 70 and the wiring layer 21, the via holes VH2 extending to the surface of the wiring pattern 21b are formed in the insulating layer 30, the vias 31a are formed in the via holes VH2, and a wiring pattern 31b connected to the vias 31a is formed. Then, the insulating layer 40 is formed on the insulating layer 30 and the wiring layer 31, the via holes VH3 extending to the surface of the wiring pattern 31b is formed in the insulating layer 40, the vias 41a are formed in the via holes VH3, and a wiring pattern 41b connected to the vias 41a is formed.

Figure 15A:
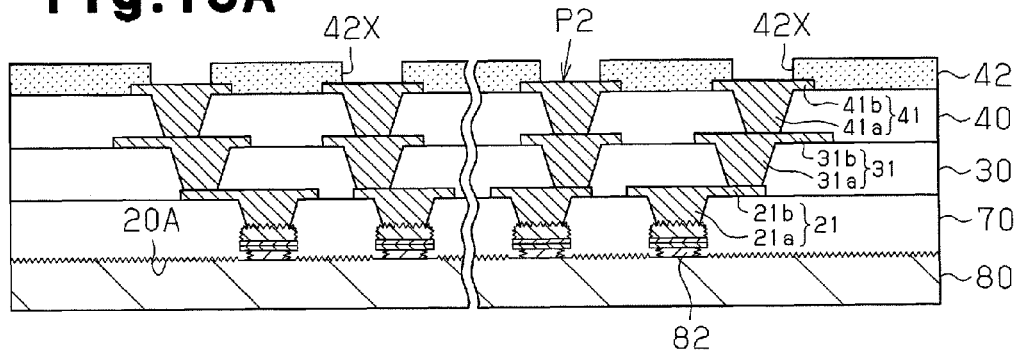
FIGS. 15A to 15D are schematic cross-sectional views illustrating different stages during the manufacturing process of the wiring substrate and semiconductor device in the second embodiment.

Then, as illustrated in FIG. 15A, a solder resist layer 42, which has openings 42X exposing the pads P2 formed at predetermined locations in the fourth wiring layer 41, are formed on the insulating layer 40 and the wiring layer 41.

Figure 15B:
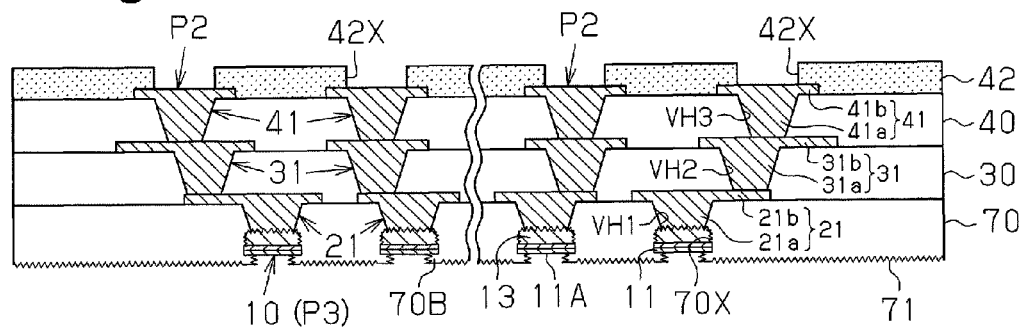

Then, as illustrated in FIG. 15B, the support body 80, which has been used as a provisional substrate, and the plating layer 82 are removed (removal step). For example, when copper foil is used as the support body 80 and the plating layer 82 is formed from Cu, the support body 80 and the plating layer 82 may be removed by performing wet etching using an aqueous iron (II) oxide solution, an aqueous copper (II) oxide solution, an aqueous ammonium persulfate solution, or the like. The removal step forms the recesses 70X in the first insulating layer 70 thereby exposing the pads P3 from the first insulating layer 70 through the recesses 70X. During the removal step, the first surface 11A of the first metal layer 11 is a smooth surface and has good coating properties. This suppresses the entry of etching liquid into the third metal layer 13 and suppresses the occurrence of pinholes. Further, the edges of the pads P3 from which etching solution is liable to enter are covered by the projections 70B in the first insulating layer 70. This suppresses etching of the third metal layer 13 that would be caused when the etching solution enters the edges. In the removal step, the first metal layer 11 of Au forms the outermost surface of the pads P3. Thus, the support body 80 and the plating layer 82 may be selectively etched and removed from the pads P3 and the first insulating layer 70.

The manufacturing process described above manufactures the wiring substrate 3 of the present embodiment.

[Method for Manufacturing Semiconductor Device]

Next, a method for manufacturing a semiconductor device 4 using the wiring substrate 3 will be described.

Figure 15C:
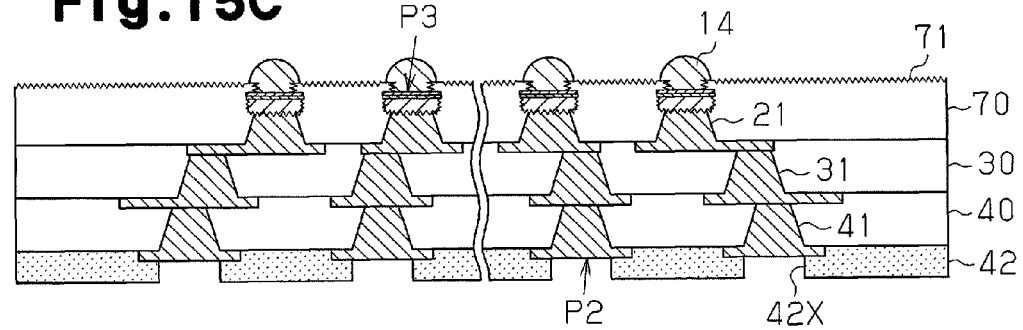
Figure 15D:
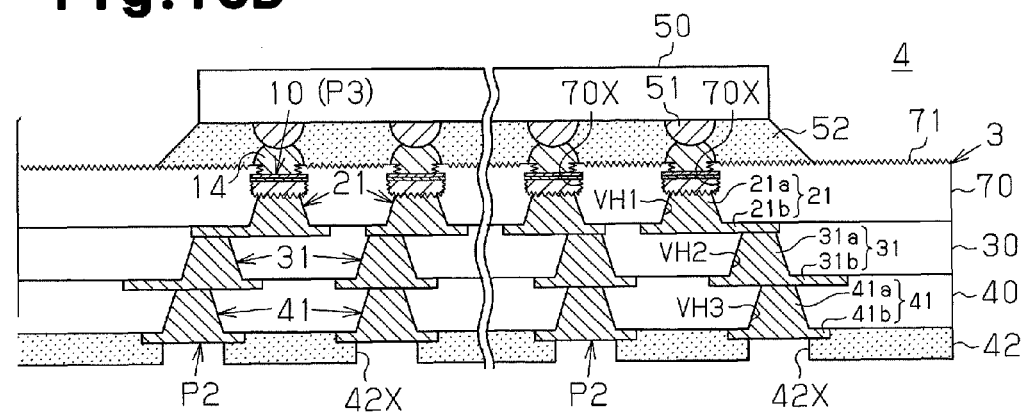

First, as illustrated in FIG. 15C, the solder 14 is formed on each pad P3 of the wiring substrate 3. Then, as illustrated in FIG. 15D, the semiconductor element 50 is positioned so that its bumps 51, which are arranged on terminals, are aligned with the pads P3. In this state, the solders 14 and the bumps 51 are melted thereby electrically connecting the semiconductor element 50 and the pads P3 (flip-chip bonding). Then, liquid underfill resin 52 is filled between the semiconductor element 50 and the first insulating layer 70 of the wiring substrate 3 and cured. The manufacturing process described above manufactures the semiconductor device 4 of the present embodiment.

The wiring substrate 1 and the method for manufacturing the wiring substrate 3 of the second embodiment have the advantage described below in addition to advantages (1) to (4) of the first embodiment.

(5) The flat surface 71A, which includes only a small amount of peaks and valleys, is formed in the first surface 71 of the first insulating layer 70 in the periphery of each pad P3 (more specifically, on the upper surfaces of the projections 70B). This facilitates the arrangement of the solder balls on the pads P3. Further, when arranging solder balls on the pads P3, the application of flux to the flat surface 71A improves the wetting properties of the solder balls compared to when applying flux to a rough surface.

It should be apparent to those skilled in the art that the present invention may be embodied in many other specific forms without departing from the spirit or scope of the invention. Particularly, it should be understood that the present invention may be embodied in the following forms.

In the above embodiments, in the smoothening step of smoothening the surface on which the pads P1 and P3 are formed, the plating layers 62 and 82 having the smooth surfaces 62A and 82A are formed. However, the present invention is not limited in such a manner. The surface on which the pads P1 and P3 are formed may be smoothened by performing etching. A method for manufacturing a wiring substrate 1A in this case will now be described. Here, an example in which the manufacturing method of the first embodiment is modified will be described.

Figure 16A:
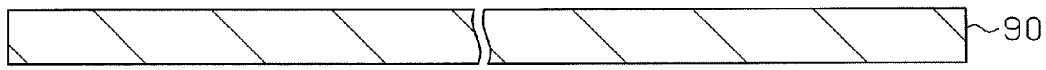
FIGS. 16A to 16E and 16G are schematic cross-sectional views illustrating different stages during the manufacturing process of the wiring substrate in the second embodiment.
Figure 16B:
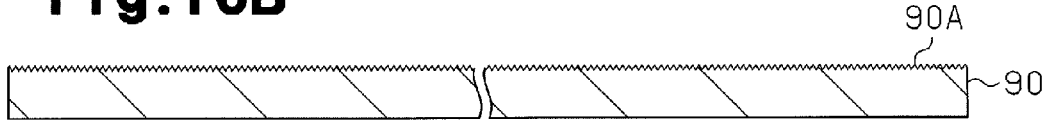

First, referring to FIG. 16A, a support body 90 is prepared. Next, referring to FIG. 16B, a roughening process is performed on the main surface 90A of the support body 90 (upper surface as viewed in FIG. 16B). This roughens the main surface 90A of the support body 90 and forms fine peaks and valleys in the main surface 90A.

Figure 16C:
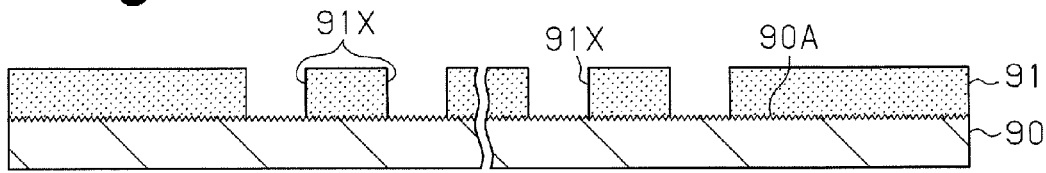

Then, as illustrated in FIG. 16C, a resist layer 91 including openings 91X is formed on the main surface 90A of the support body 90 (resist formation step). The openings 91X expose the main surface 90A of the support body 90 at portions corresponding to the regions where pads P4 (refer to FIG. 16F) are formed in a subsequent step. There are no particular limitations to the material of the resist layer 91 as long as the material has a certain resolution and includes etching resistant and plating resistant properties.

Figure 16D:
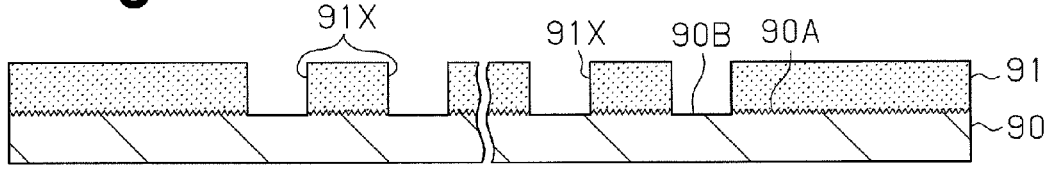

Then, referring to FIG. 16D, the main surface 90A of the support body 90 is etched using the resist layer 91 as an etching mask to smoothen the main surface 90A of the support body 90 exposed through the openings 91X of the resist layer 91 and form smooth surfaces 90B (smoothening step). This etching process is performed so that the surface roughness Ra of the smooth surface 90B becomes less than 0.21 µm. As a result, the smooth surfaces 90B including subtle peaks and valleys are formed in the support body 90 at portions exposed through the openings 91X of the resist layer 91. The etching solution used in this step may be liquid of which the main component is, for example, sulfuric acid or hydrogen peroxide.

Figure 16E:
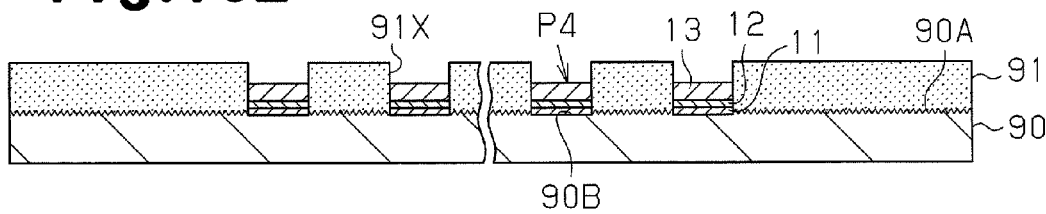
Figure 16F:
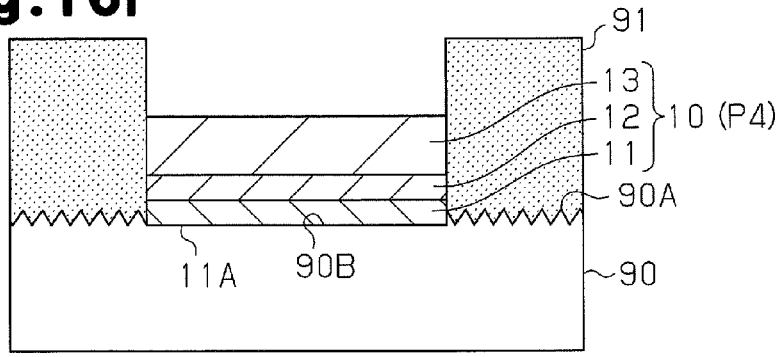
FIG. 16F is an enlarged cross-sectional view illustrating a main part of FIG. 16E.

Next, referring to FIG. 16E, electroplating is performed on the smooth surface 90B of the support body 90 using the resist layer 91 as a plating mask. This sequentially laminates the first metal layer 11, second metal layer 12, and third metal layer 13 on each smooth surface 90B (pad formation step). The first to third metal layers 11 to 13 form the pads P4. Referring to FIG. 16F, the first surface 11A of the first metal layer 11 is in contact with the smooth surface 90B of the support body 90 and shaped in conformance with the smooth surface 90B. That is, the shape of the smooth surface 90B is transferred to the first surface 11A of the first metal layer 11. Thus, the first surface 11A of the first metal layer 11 is a smooth surface including subtle peaks and valleys. More specifically, the surface roughness Ra of the first surface 11A of the first metal layer 11 is less than 0.21 µm.

Figure 16G:
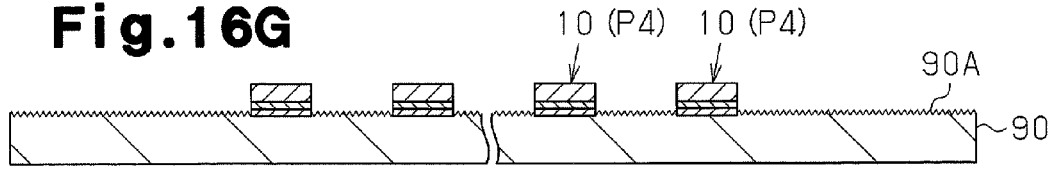
Figure 17A:
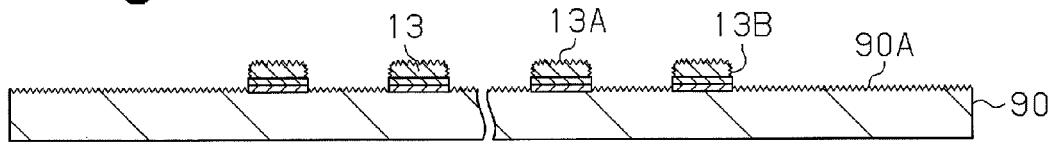
FIGS. 17A to 17F are schematic cross-sectional views illustrating different stages during the manufacturing process of a wiring substrate and semiconductor device in a modification.

Then, referring to FIG. 16G, the resist layer 91 used as the etching mask and plating mask is removed. Next, referring to FIG. 17A, a roughening process is performed on the first surfaces 13A and the side surfaces 13B of the third metal layer 13. The roughening process is performed so that the surface roughness Ra of the first surface 13A of the third metal layer 13 becomes 0.5 to 2 µm.

Figure 17B:
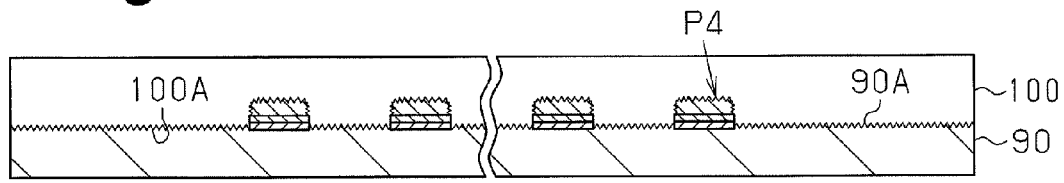

Then, referring to FIG. 17B, a first insulating layer 100 is formed on a main surface 90A of the support body 90 to cover the pads P4. The first insulating layer 100 serves as the "outermost insulating layer" of the present invention. The shape (roughed surface) of each main surface 90A of the support body 90 is transferred to a first surface 100A of the first insulating layer 100, which is in contact with the main surface 90A of the support body 90. Thus, fine peaks and valleys are formed in the first surface 100A of the first insulating layer 100.

Subsequently, referring to FIG. 17C, the via holes VH1 are formed at predetermined locations in the first insulating layer 100 to expose the first surfaces 13A of the third metal layer 13. Then, referring to FIG. 17D, the via holes VH1 are filled with a via conductor to form the vias 21a. Further, a wiring pattern 21b connected by the vias 21a to the pads P4 is formed on the first insulating layer 100.

Figure 17C:
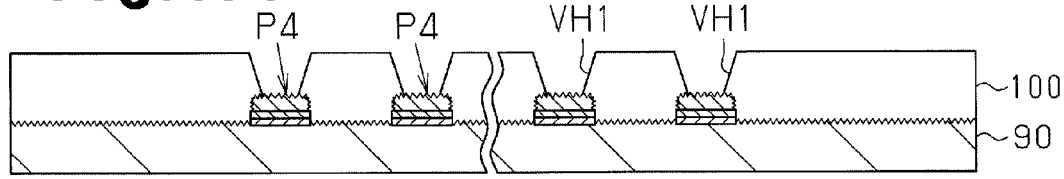
Figure 17D:
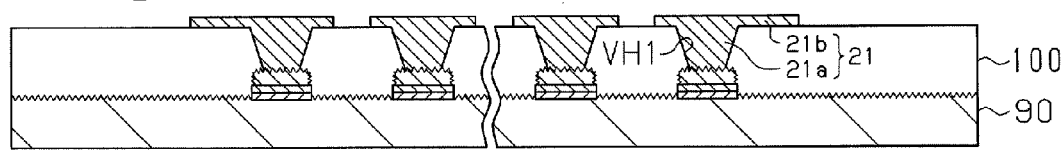
Figure 17E:
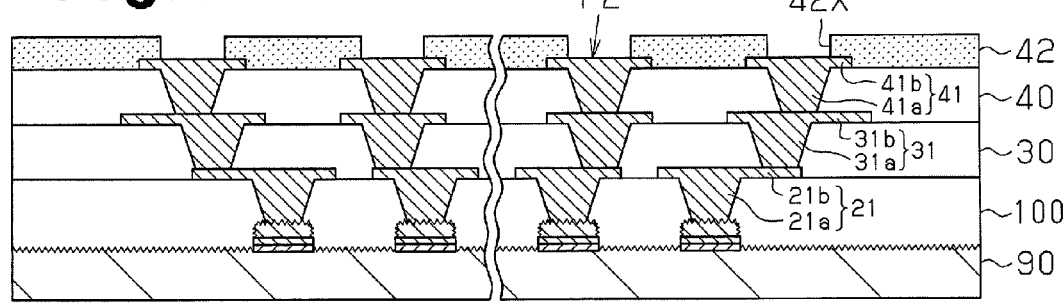

Then, referring to FIG. 17E, the steps of FIGS. 17B to 17D are repeated to alternately form the second and third insulating layers 30 and 40 and the third and fourth wiring layers 31 and 41. Next, a solder resist layer 42 including openings 42X for exposing pads P2 arranged at predetermined locations in the fourth wiring layer 41 are formed on the insulating layer 40 and the wiring layer 41.

Figure 17F:
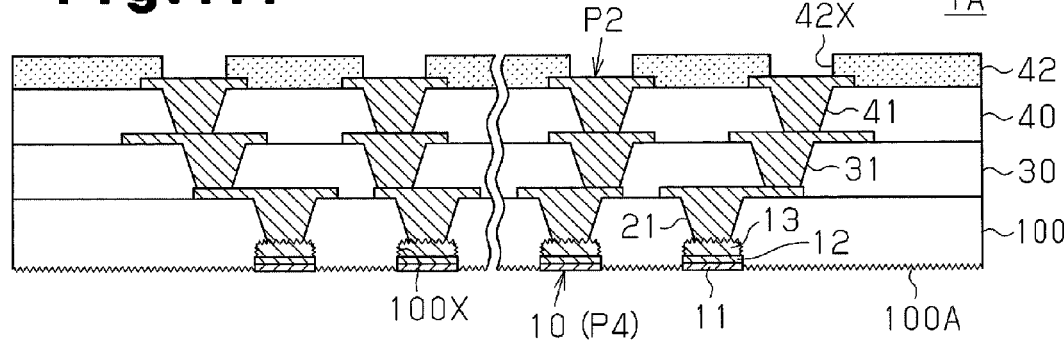

Subsequently, referring to FIG. 17F, the support body 90 that has been used as a provisional substrate is removed. When, for example, copper foil is used as the support body 90, the support body 90 may be removed by performing wet etching using an aqueous iron (II) oxide solution, an aqueous copper (II) oxide solution, an aqueous ammonium persulfate solution, or the like. The first metal layer 11 of Au is formed on the outermost surface of the pads P4. This allows for the support body 90 to be selectively etched and removed from the pads P4 and the first insulating layer 100. As a result, the pads P4 are exposed through the recesses 100X of the first insulating layer 100. Referring to FIG. 17F, in the wiring substrate 1A that is manufactured in this manner, the first surface 11A of the first metal layer 11 is substantially flush with the first surface 100A of the first insulating layer 100.

A modification of the manufacturing method of the first embodiment has been described. However, a similar modification may be made to the manufacturing method of the second embodiment.

In the first embodiment, the surface on which the pads P1 are formed serves as a chip mounting surface, and the surface on which the external connection pads P2 are formed serves as an external connection terminal bonding surface. However, the present invention is not limited in such a manner. For example, as illustrated FIG. 18A, the surface on which the pads P1 are formed may serve as an external connection terminal bonding surface, and the opposite surface may serve as a chip mounting surface. In this case, external connection terminals such as solder balls, pins, and the like, which are used to mount the wiring substrate 1B on a motherboard or the like, are bonded to the pads P1. Further, bumps 51 of a semiconductor element 50 mounted on the wiring substrate 1B are flip-chip connected by solder 45 or the like to the wiring pattern 41b formed on the surface opposite to the side where the pads P1 have been formed. The method for manufacturing the wiring substrate 1B and the semiconductor device 2B are basically the same as the manufacturing steps illustrated in FIG. 4 to FIG. 7 and thus will not be described.

In the second embodiment, the surface on which the pads P3 are formed serves as a chip mounting surface, and the surface on which the external connection pads P2 are formed serves as an external connection terminal bonding surface. However, the present invention is not limited in such a manner. For example, as illustrated in FIG. 18B, the surface on which the pads P3 are formed may serve as an external connection terminal bonding surface, and the opposite surface may serves as a chip mounting surface. In this case, external connection terminals such as solder balls, lead pins, and the like, which are used to mount the wiring substrate 3A on a motherboard or the like, are bonded to the pads P3. Further, bumps 51 of a semiconductor element 50 mounted on the wiring substrate 3A are flip-chip connected by solder 45 or the like to the wiring pattern 41b formed on the surface opposite to the side where the pads P3 have been formed. The method for manufacturing the wiring substrate 3A and the semiconductor device 4A are basically the same as the manufacturing steps illustrated in FIGS. 13 to 15 and thus will not be described.

Figure 18A:
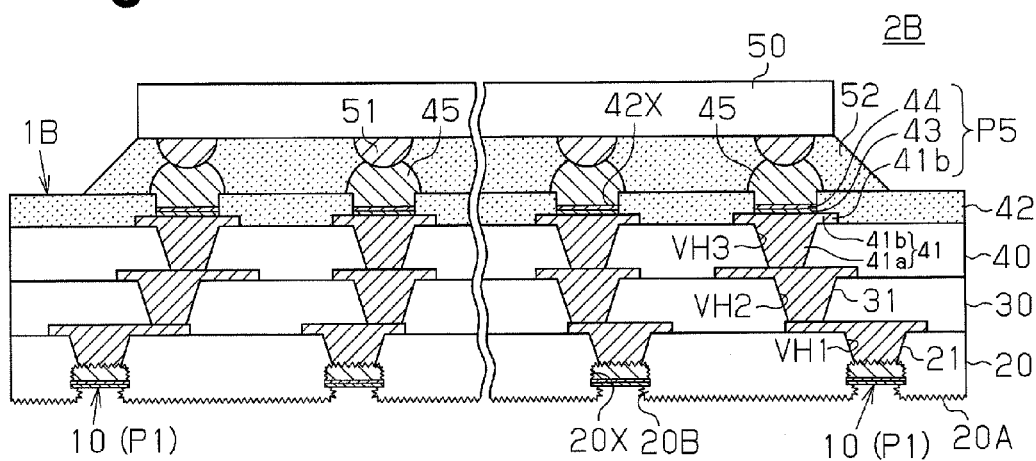
FIGS. 18A and 18B are schematic cross-sectional views illustrating a semiconductor device in a modification.
Figure 18B:
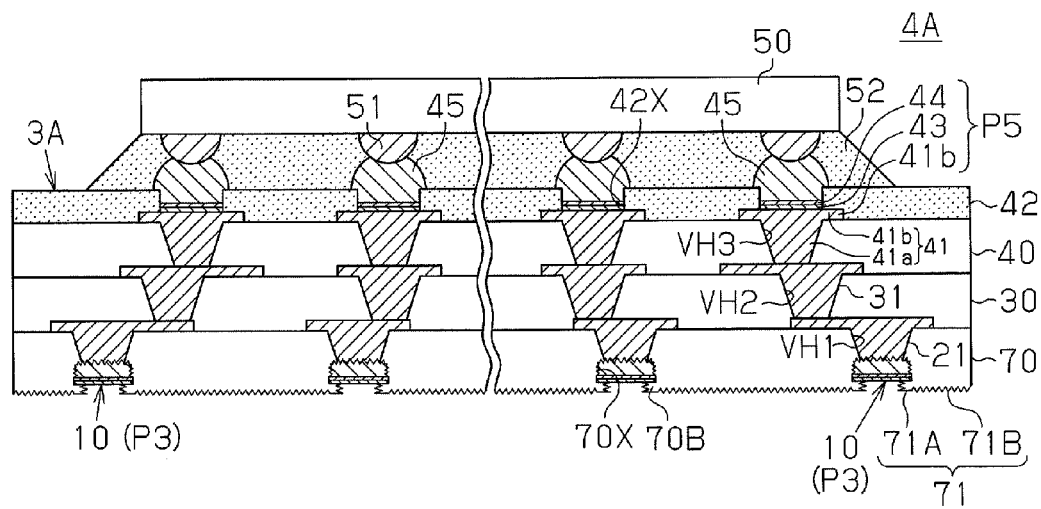

In the examples of FIGS. 18A and 18B, to improve the contact properties with the bumps 51 of the semiconductor element 50 and the like, pads P5 are formed on the wiring pattern 41b by sequentially laminating a metal layer 43 of Pd and a metal layer 44 of Au or Ag. The metal layers 43 and 44 can be formed by performing electroless plating, for example.

In each of the embodiments described above, external connection terminals, such as solder balls, lead pins, and the like, are connected to the pads P2 and P3. However, the pads P2 and P3 may be directly used as external connection terminals.

In each of the embodiments described above, the pads P1, P2, and P3 have circular shapes as described above. However, the pad shapes are not limited in such a manner. The pads Pl, P2, and P3 may have a shape that is not circular, for example, tetragonal or polygonal.

In each of the embodiments described above, the semiconductor element 50 is mounted on the wiring substrate 1, 1B, 3, or 3A. However, the mounted object is not limited to a semiconductor element 50. For example, the present invention may be applied to a package (package on package) having a structure in which another wiring substrate is stacked on the wiring substrate 1, 1B, 3, or 3A.

Figure 19A:
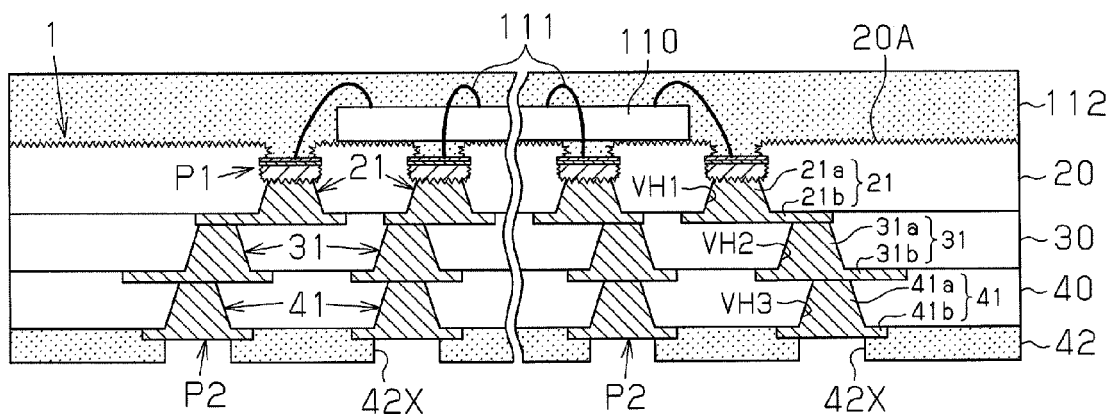
FIGS. 19A and 19B are schematic cross-sectional views illustrating a semiconductor device in a modification.

In the semiconductor devices 2 and 4 of the embodiments described above, the semiconductor element 50 is flip-chip bonded to the pads P1 or P3 of the wiring substrate 1 or 3. However, the present invention is not limited in such a manner. For example, as illustrated in FIG. 19A, for example, electrode terminals on an upper surface of the semiconductor element 110 may be connected by bonding wires 111 to the pads P1 in the wiring substrate 1. In this case, the region including the semiconductor element 110, the bonding wires 111, and the like is sealed by a sealing resin 112.

Figure 19B:
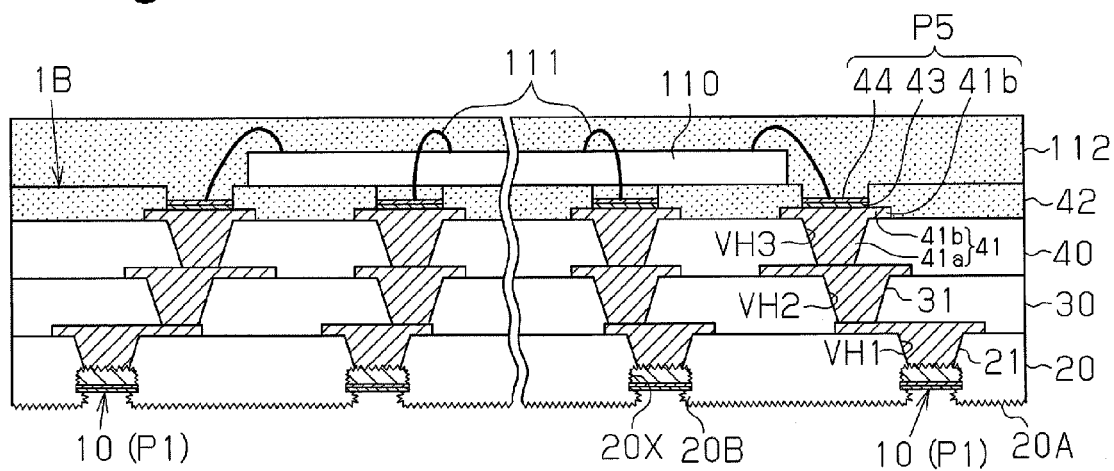

In the semiconductor devices 2B and 4A illustrated in FIGS. 18A and 18B, a semiconductor element 50 is flip-chip bonded to pads P5 of the wiring substrate 1B or 3A. However, the present invention is not limited in such a manner. For example, as illustrated in FIG. 19B, for example, electrode terminals on the upper surface of the semiconductor element 110 may be connected by bonding wires 111 to the pads P5 in the wiring substrate 1B. In this case, the region including the semiconductor element 110, the bonding wires 111, and the like is sealed by a sealing resin 112.

Figure 20:
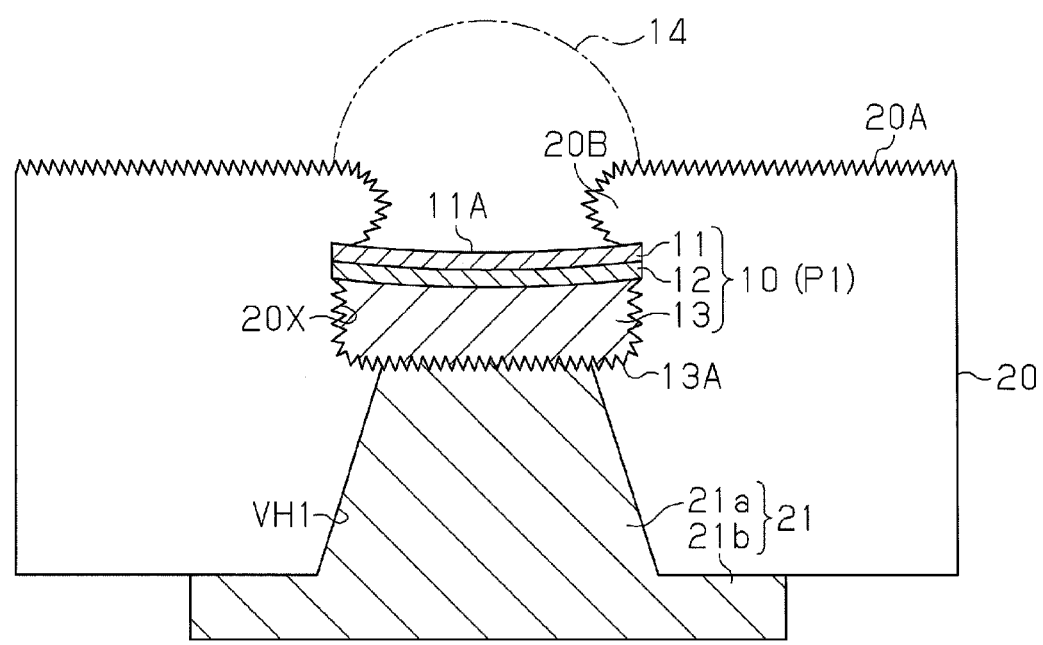
FIG. 20 is an enlarged cross-sectional view illustrating a wiring substrate in a modification.

In the each of the embodiments described above, the first surface 11A of the first metal layer 11 is a flat surface that is substantially parallel to the second surface 20C of the first insulating layer 20 (surface that is not roughened) located on the opposite side of the first surface 20A. However, the present invention is not limited in such a manner. For example, as illustrated in FIG. 20, the first surface 11A of the first metal layer 11 may be curved inward toward the pads P1 (more specifically, towards the second metal layer 12 and the third metal layer 13). As a result, when, for example, solder balls are arranged on the pads P1, the contact area between the solder balls and the first surface 11A of the first metal layer 11 increases. This stably supports the solder balls.

Such pads P1 can be formed, for example, in the step illustrated in FIG. 4D, by forming the surface 62A of the plating layer 62 to curve in an upwardly projecting manner. Then, the first metal layer 11, the second metal layer 12, and the third metal layer 13 are sequentially laminated on the surface 62A, and the support body 60 and the plating layer 62 are ultimately removed in a removal step such as that illustrated in FIG. 6E. The plating layer 62 having such a shape can be formed by adjusting the plating process conditions, such as the composition of the plating solution, the current density, and the like. The third metal layer 13 may be eliminated from the pads P1, P3, and P4 in each of the embodiments described above. In this case, the layer structure of each of the pads P1, P3, and P4 is a two-layer structure consisting essentially of a first metal layer 11 of Au or the like and a second metal layer 12 of Pd or the like that are formed between the first metal layer 11 and the vias 21a. Such a structure also obtains the advantages of the embodiments described above.

The present examples and embodiments are to be considered as illustrative and not restrictive, and the invention is not to be limited to the details given herein, but may be modified within the scope and equivalence of the appended claims.

The invention claimed is:

1. A wiring substrate comprising:
a wiring layer;
an outermost insulating layer laminated to the wiring layer; and
a pad electrically connected to the wiring layer and exposed from a surface of the outermost insulating layer, wherein
the pad consists essentially of:
a first metal layer including a first surface, which is exposed from the surface of the outermost insulating layer, and a second surface, which is located opposite to the first surface;
a second metal layer, which is laminated to the second surface of the first metal layer; and
a third metal layer, which is formed between the second metal layer and the wiring layer, wherein
the first metal layer is formed from a metal selected from gold and silver or from an alloy including at least one of gold and silver,
the second metal layer is formed from palladium or a palladium alloy, and
the third metal layer is formed from copper or a copper alloy;
the outermost insulating layer includes a side wall that defines a recess exposing the first metal layer of the pad;
the side wall includes a rough surface that serves as an inner wall of the recess, wherein the rough surface of the side wall includes
a basal end contacting the first metal layer of the pad and defining an exposed surface of the first metal layer of the pad exposed through the recess, and
a distal end projecting from the basal end toward a center of the recess and away from the exposed surface of the first metal layer of the pad, wherein the distal end is the most projecting portion of the rough surface;
the basal end and the distal end define a projection in the inner wall of the recess along the surface of the outermost insulating layer, wherein the projection has a curved surface in a cross-sectional view; and
a first contact surface between the third metal layer and the outermost insulating layer has a different surface roughness than a second contact surface between the wiring layer and the outermost insulating layer.

2. The wiring substrate according to claim 1, wherein the first surface of the first metal layer has a surface roughness Ra of less than 0.21 μm.

3. A wiring substrate comprising:
a wiring layer;
an outermost insulating layer laminated to the wiring layer; and
a pad electrically connected to the wiring layer and exposed from a surface of the outermost insulating layer, wherein:
the pad consists essentially of:
a first metal layer including a first surface, which is exposed from the surface of the outermost insulating layer, and a second surface, which is located opposite to the first surface;
a second metal layer, which is laminated to the second surface of the first metal layer; and
a third metal layer, which is formed between the second metal layer and the wiring layer, wherein
the first metal layer is formed from a metal selected from gold and silver or from an alloy including at least one of gold and silver,
the second metal layer is formed from palladium or a palladium alloy, and
the third metal layer is formed from copper or a copper alloy;
the outermost insulating layer includes a side wall that defines a recess exposing the first metal layer of the pad;
the side wall includes a projection projecting from the side wall and covering part of the first metal layer of the pad;
the projection includes a first rough surface including fine peaks and valleys; and
the surface of the outermost insulating layer includes
the first rough surface of the projection that is in contact with the first surface of the first metal layer,
a flat surface that is continuous with the first rough surface of the projection in the vicinity of the side wall of the recess, and
a second rough surface that is continuous with the flat surface and includes fine peaks and valleys.

4. The wiring substrate according to claim 3, wherein the surface of the first metal layer has a surface roughness Ra of less than 0.21 μm.

5. The wiring substrate according to claim 1, wherein the outermost insulating layer is an outermost, exposed insulating layer.

6. The wiring substrate according to claim 1, wherein:
the wiring layer includes a wiring pattern and a via wiring on the wiring pattern;
the outermost insulating layer is laminated to the wiring pattern;
the via wiring is buried within the outermost insulating layer;
the third metal layer is formed between the second metal layer and the via wiring;
the third metal layer includes a rough surface that is in contact with the outermost insulating layer and the via wiring;
the first surface of the first metal layer has a surface roughness Ra of less than 0.21 μm; and
the rough surface of the third metal layer and the rough surface of the side wall each have a surface roughness Ra of 0.5 to 2 μm.

7. The wiring substrate according to claim 3, wherein the outermost insulating layer is an outermost, exposed insulating layer.

8. The wiring substrate according to claim 3, wherein:
the wiring layer includes a wiring pattern and a via wiring on the wiring pattern;
the outermost insulating layer is laminated to the wiring pattern;
the via wiring is buried within the outermost insulating layer;
the third metal layer is formed between the second metal layer and the via wiring;
the third metal layer includes a rough surface that is in contact with the outermost insulating layer and the via wiring;

the first surface of the first metal layer has a surface roughness Ra of less than 0.21 μm; and
the rough surface of the third metal layer and the rough surface of the side wall each have a surface roughness Ra of 0.5 to 2 μm.

* * * * *